(12) United States Patent  (10) Patent No.: US 8,687,358 B2
Nakasaka et al.  (45) Date of Patent: Apr. 1, 2014

(54) POWER CONVERSION APPARATUS

(75) Inventors: Akira Nakasaka, Anjo (JP); Masao Murakami, Anjo (JP)

(73) Assignee: Denso Corporation, Kariya (JP)

( * ) Notice: Subject to any disclaimer, the term of this patent is extended or adjusted under 35 U.S.C. 154(b) by 52 days.

(21) Appl. No.: 13/021,934

(22) Filed: Feb. 7, 2011

(65) Prior Publication Data

US 2011/0194322 A1  Aug. 11, 2011

(30) Foreign Application Priority Data

Feb. 5, 2010 (JP) ................................. 2010-024557
Oct. 29, 2010 (JP) ................................. 2010-244595

(51) Int. Cl.
*H05K 7/20* (2006.01)
(52) U.S. Cl.
USPC ............... 361/679.54; 361/679.47; 361/688; 361/704; 361/710; 363/141
(58) Field of Classification Search
USPC ............. 361/679.46–679.47, 679.52–679.54, 361/688–690, 698–704, 707, 715–718, 725, 361/728, 763–764, 821, 829–832
See application file for complete search history.

(56) References Cited

U.S. PATENT DOCUMENTS

| | | | | |
|---|---|---|---|---|
| 5,258,888 A * | 11/1993 | Korinsky | ...................... | 361/704 |
| 5,497,289 A * | 3/1996 | Sugishima et al. | ........... | 361/709 |
| 5,631,821 A * | 5/1997 | Muso | ............................ | 363/141 |
| 6,166,937 A * | 12/2000 | Yamamura et al. | .......... | 363/141 |
| 7,248,478 B2 * | 7/2007 | Inoue | ............................ | 361/699 |
| 7,542,318 B2 | 6/2009 | Otsuka et al. | | |
| 7,663,886 B2 | 2/2010 | Aoki et al. | | |
| 8,149,577 B2 * | 4/2012 | Tang et al. | .................... | 361/688 |
| 8,189,324 B2 * | 5/2012 | Folts | ............................ | 361/676 |
| 8,213,179 B2 | 7/2012 | Yoshida et al. | | |
| 2003/0133319 A1 | 7/2003 | Radosevich et al. | | |
| 2006/0096299 A1 * | 5/2006 | Mamitsu et al. | ................. | 62/3.2 |
| 2006/0232939 A1 * | 10/2006 | Inoue | ............................ | 361/704 |
| 2006/0243422 A1 | 11/2006 | Sakai et al. | | |

(Continued)

FOREIGN PATENT DOCUMENTS

| | | |
|---|---|---|
| CN | 1906840 | 1/2007 |
| JP | 2002-043782 | 2/2002 |

(Continued)

OTHER PUBLICATIONS

Japanese Office Action dated Jan. 10, 2012, issued in corresponding Japanese Application No. 2010-244594, with English translation.

(Continued)

*Primary Examiner* — Courtney Smith
(74) *Attorney, Agent, or Firm* — Nixon & Vanderhye P.C.

(57) ABSTRACT

The power conversion apparatus includes electronic components constituting a power conversion circuit, a cooler for cooling at least some of the electronic components, and a case housing the at least some of the electronic components and the cooler. The at least some of the electronic components and the cooler are fixed to and integrated in a frame as an internal unit. The frame has such a shape that at least some of the electronic components constituting the internal unit are disposed inside the frame. The frame includes a terminal block on which input/output terminals for inputting and outputting controlled power are mounted for providing connection between the input/output terminals and external devices.

9 Claims, 30 Drawing Sheets

(56) References Cited

U.S. PATENT DOCUMENTS

| | | |
|---|---|---|
| 2007/0002594 A1 | 1/2007 | Otsuka et al. |
| 2007/0076355 A1 | 4/2007 | Oohama |
| 2007/0165376 A1* | 7/2007 | Bones et al. .................. 361/688 |
| 2007/0215316 A1* | 9/2007 | Saito et al. ..................... 165/41 |
| 2007/0295715 A1 | 12/2007 | Saka et al. |
| 2008/0158824 A1 | 7/2008 | Aoki et al. |
| 2008/0205107 A1 | 8/2008 | Hattori et al. |
| 2009/0040724 A1 | 2/2009 | Nishikimi et al. |
| 2009/0241575 A1 | 10/2009 | Jadric et al. |
| 2009/0251859 A1 | 10/2009 | Harada et al. |
| 2010/0091464 A1 | 4/2010 | Oonishi et al. |
| 2011/0194246 A1 | 8/2011 | Nakasaka et al. |
| 2011/0194247 A1 | 8/2011 | Nakasaka et al. |
| 2011/0194248 A1 | 8/2011 | Nakasaka et al. |
| 2011/0194249 A1 | 8/2011 | Nakasaka et al. |
| 2012/0039039 A1 | 2/2012 | Nishikimi et al. |
| 2012/0170217 A1 | 7/2012 | Nishikimi et al. |

FOREIGN PATENT DOCUMENTS

| | | |
|---|---|---|
| JP | 2005-516570 | 6/2005 |
| JP | P2006-174572 A | 6/2006 |
| JP | P2007-014085 A | 1/2007 |
| JP | P2007-036214 A | 2/2007 |
| JP | P2008-166358 A | 7/2008 |
| JP | 2008-215089 | 9/2008 |
| JP | 4225310 | 12/2008 |
| JP | 2009-044891 | 2/2009 |
| JP | 2009-130964 | 6/2009 |
| JP | 2009-159767 | 7/2009 |
| JP | 2009-261125 | 11/2009 |
| JP | P2009-266986 A | 11/2009 |
| JP | P2010-010505 A | 1/2010 |

OTHER PUBLICATIONS

Nakasaka et al, U.S. Appl. No. 13/021,926, filed Feb. 7, 2011.
Nakasaka et al, U.S. Appl. No. 13/021,931, filed Feb. 7, 2011.
Nakasaka et al, U.S. Appl. No. 13/021,937, filed Feb. 7, 2011.
Nakasaka et al, U.S. Appl. No. 13/021,948, filed Feb. 7, 2011.
Office Action dated Dec. 10, 2012 in related U.S. Appl. No. 13/021,926.
Official Action dated Aug. 1, 2012, issued in copending U.S. Appl. No. 13/021,948 of Nakasaka, filed Feb. 7, 2011.
Japanese Office Action dated Jun. 26, 2012, issued in corresponding Japanese Application No. 2010-244592, with English translation.
Japanese Office Action dated Jun. 26, 2012, issued in corresponding Japanese Application No. 2010-244595, with English translation.
Office Action issued in Japanese Patent Appl. No. 2010-244595 on Jan. 8, 2013, with an English Language Translation.
Office Action issued on Mar. 28, 2013 in co-pending U.S. Appl. No. 13/021,937.
Office Action (2 pages) dated Jan. 8, 2013 issued in corresponding Japanese Application No. 2010-244592 and English translation (2 pages).
Official Action (13 pages) dated Jan. 31, 2013, issued in copending U.S. Appl. No. 13/021,931 of Nakasaka, filed Feb. 7, 2011.
Official Action (7 pages) dated Feb. 7, 2013, issued in copending U.S. Appl. No. 13/021,948 of Nakasaka, filed Feb. 7, 2011.
Office Action issued in Chinese Patent Appl. 201110036400.4 on Mar. 18, 2013 along with English Language Translation.
Office Action issued in Japanese Patent Appl 2010-244595 dated Jul. 9, 2013 with English Language Translation of thereof.

* cited by examiner

POWER CONVERSION APPARATUS

This application claims priority to Japanese Patent Applications No. 2010-244595 filed on Oct. 29, 2010, and No. 2010-24557 filed on Feb. 5, 2010, the entire contents of which are hereby incorporated by reference.

BACKGROUND OF THE INVENTION

1. Field of the Invention

The present invention relates to a power conversion apparatus in which electronic components constituting a power conversion circuit and a cooler for cooling at least some of the electronic components are housed in its case.

2. Description of Related Art

An electric vehicle or a hybrid vehicle is equipped with a power conversion apparatus such as an inverter or a converter to convert source power into driving power for a drive motor. As shown in FIG. 35, such a power conversion apparatus 9 includes various electronic components including semiconductor modules 921 each incorporating therein switching elements, and a capacitor 922. For example, refer to Japanese patent Application Laid-Open No. 2009-159767. To prevent the temperature of the semiconductor modules 921 from increasing excessively, a cooler 93 is disposed in contact with the semiconductor modules 921.

The power conversion apparatus 9 further includes a control circuit board 96 on which a control circuit for controlling the semiconductor modules 921 is formed. The electronic components including the semiconductor modules 921, the cooler 93 and the control circuit board 96 are fixed to a case 94, and sealingly enclosed within the case 94.

The power conversion apparatus 9 further includes a terminal block (not shown) on which input/output terminals for receiving and outputting a controlled current are mounted, for connection between these input/output terminals and terminals of external devices.

Accordingly, if the case 94 is not rigid enough, the electronic components fixed to the case 94 may vibrate considerably, causing wire breakage, or failure in the electronic components due to external force applied thereto.

Further, when the power conversion apparatus 9 is located in an engine compartment of a vehicle, the case 94 may expand or contract considerably due to abrupt temperature change. In this case, since the components are fixed directly to the case 94, they may fail due to thermal stress applied to them.

The case 94 of the power conversion apparatus 9 is constituted of a case body 940, and bottom and top lids 941 and 942. Accordingly, the case 94 has two large sealing surfaces required to be water-tight. Accordingly, since the case 94 has to be provided with many sealing members, the power conversion apparatus 9 is disadvantageous in the manufacturing cost.

In addition, the maintainability of the power conversion apparatus 9 is not good enough in this case, because both the bottom lid 941 and the top lid 942 have to be removed for maintenance work. It might be possible that the case 94 has only one sealing surface, if the case 94 is constituted of a bottomed case body and a top lid. However, in this case, the maintainability and rigidity of the case 94 may become worse.

Further, since vibration of the electronic components directly fixed to the case 94 can transmit to a vehicle body through the case 94, unpleasant vibration sound may occur in the vehicle cabin. Conversely, since vibration of a vehicle engine can transmit to the electronic components through the case 94, wire breakage or fault may occur.

Further, assembling the terminal block in a predetermined position of the case 94 during manufacture of the power conversion apparatus 9 is not an easy task.

SUMMARY OF THE INVENTION

The present invention provides a power conversion apparatus comprising:

electronic components constituting a power conversion circuit;

a cooler for cooling at least some of the electronic components; and a case housing the at least some of the electronic components and the cooler;

wherein the at least some of the electronic components and the cooler are fixed to and integrated in a frame as an internal unit, the frame having such a shape that at least some of the electronic components constituting the internal unit are disposed inside the frame, and the frame includes a terminal block on which input/output terminals for inputting and outputting controlled power are mounted for providing connection between the input/output terminals and external devices.

According to the present invention, there is provided at a low cost a power conversion apparatus which has a case rigid enough to significantly reduce external force applied to electronic components accommodated in the case, easy to assemble a terminal block, and is excellent in maintainability.

Other advantages and features of the invention will become apparent from the following description including the drawings and claims.

PREFERRED EMBODIMENTS OF THE INVENTION

First Embodiment

Figure 1:
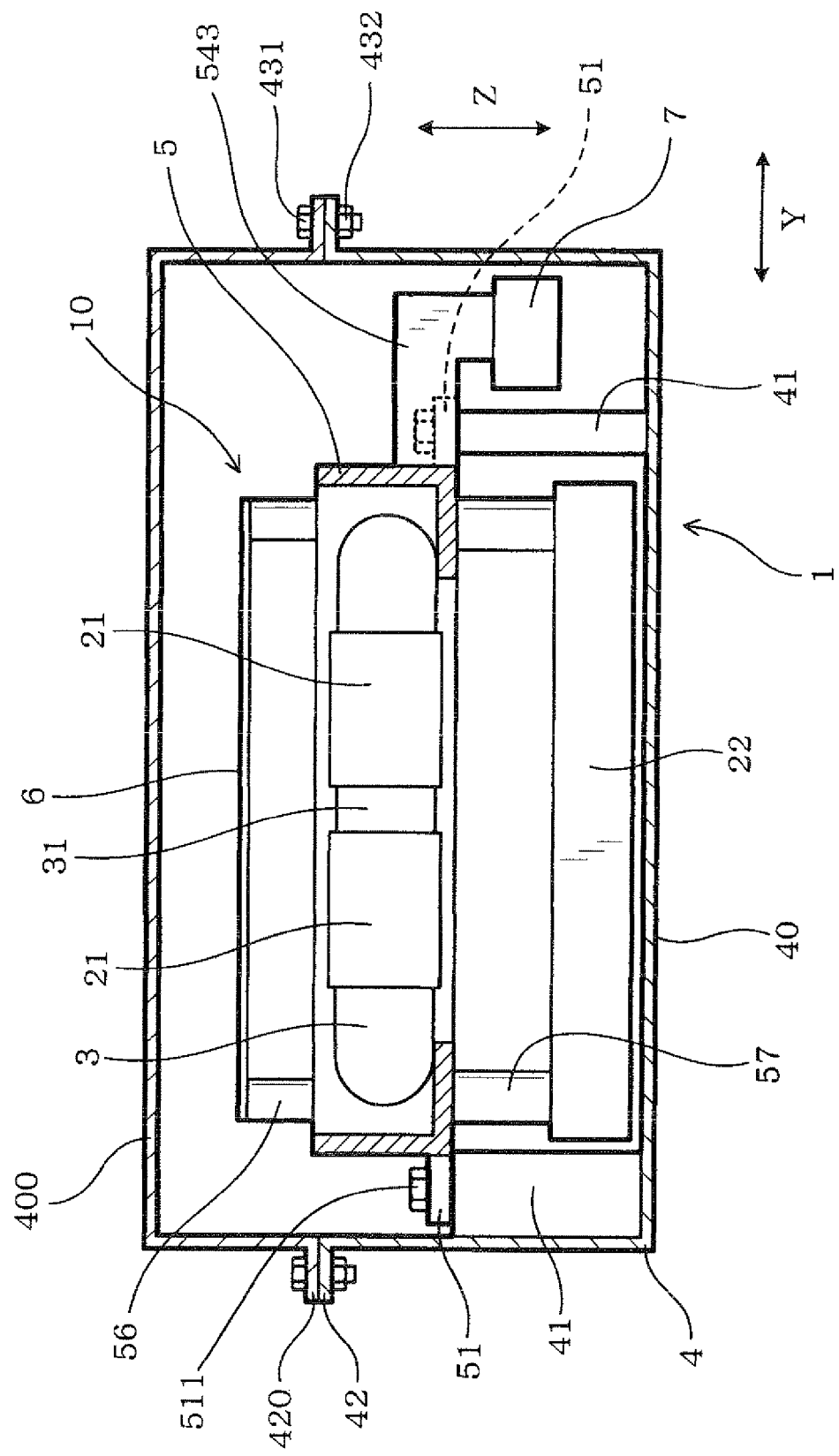
FIG. 1 is a schematic explanatory sectional view of a power conversion apparatus according to a first embodiment of the invention.

A power conversion apparatus 1 according to a first embodiment of the invention is described with reference to FIGS. 1 to 19. As shown in FIG. 1, the power conversion apparatus 1 of this embodiment is constituted of electronic components including semiconductor modules 21 and a capacitor 22, a cooler 3 for cooling at least some of the electronic components (the semiconductor modules 21 in this embodiment), and a case 4 housing the electronic components and the cooler 3. The semiconductor modules 21 and the cooler 3 are fixed to and integrated with a frame 5 to constitute an internal unit 10. The internal unit 10 is fixed to the case 4, and sealingly enclosed within the case 4.

Figure 16:
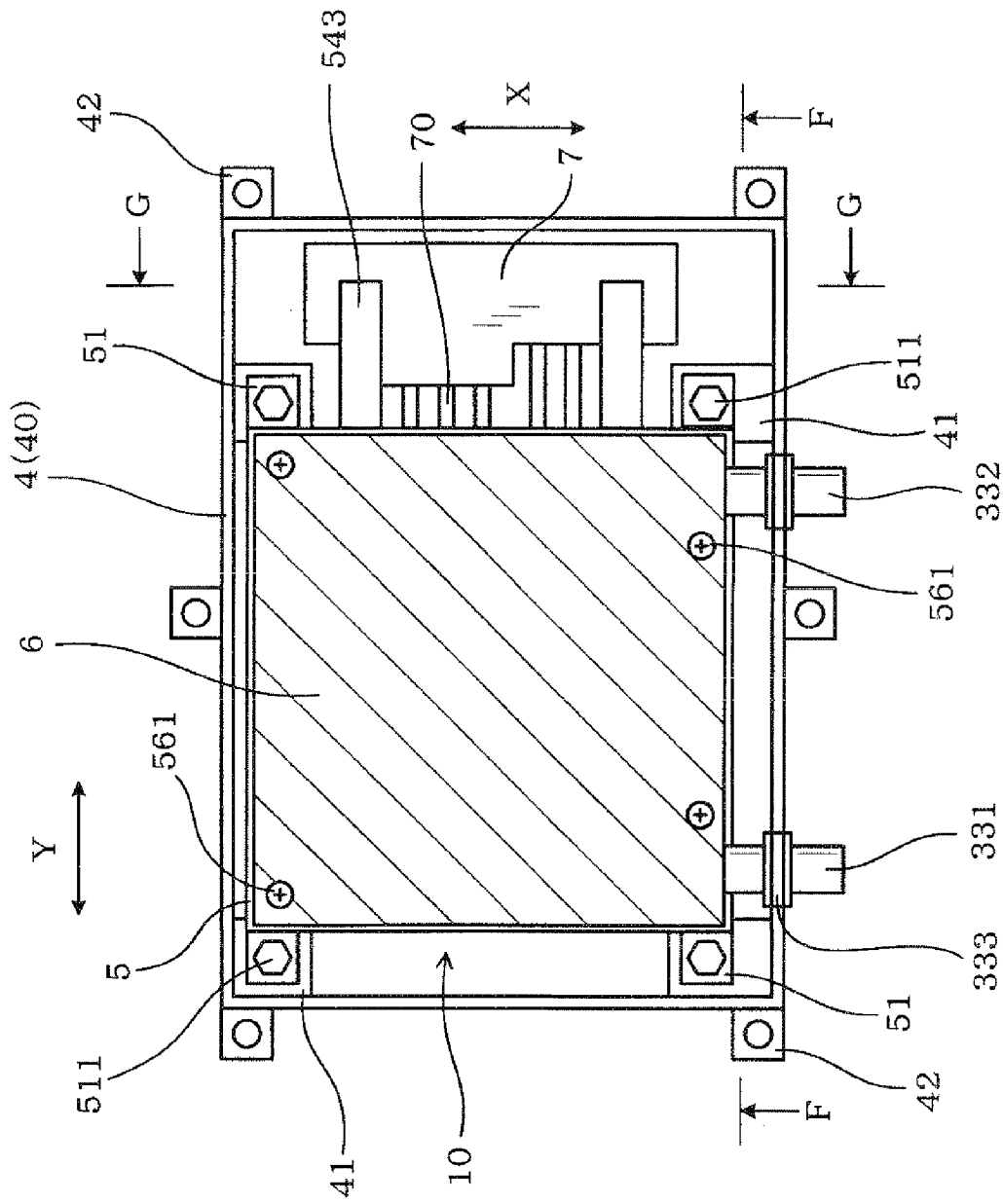
FIG. 16 is a plan view of the internal unit housed in a case of the first embodiment.
Figure 17:
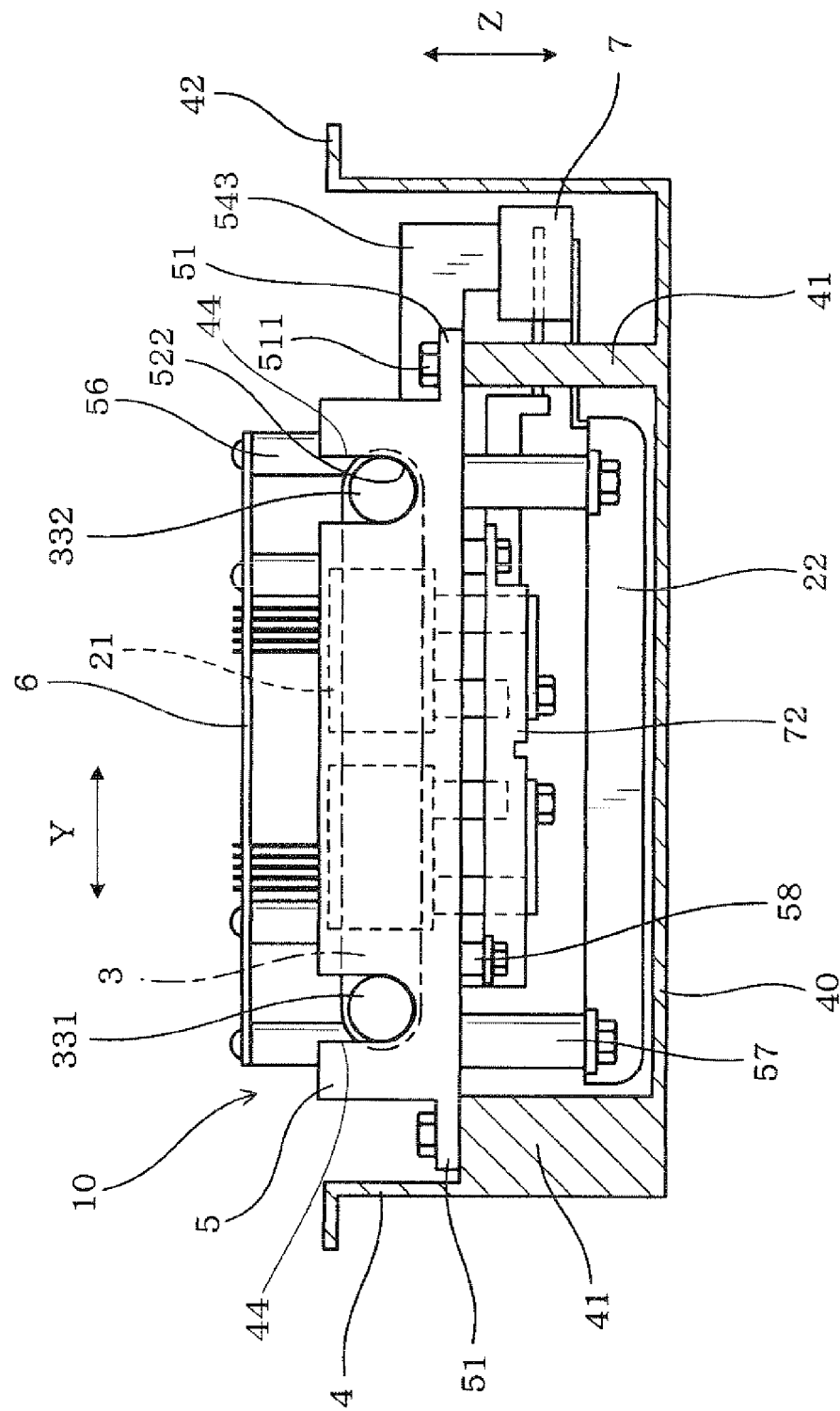
FIG. 17 is a cross-sectional view of FIG. 16 along the line F-F.
Figure 18:
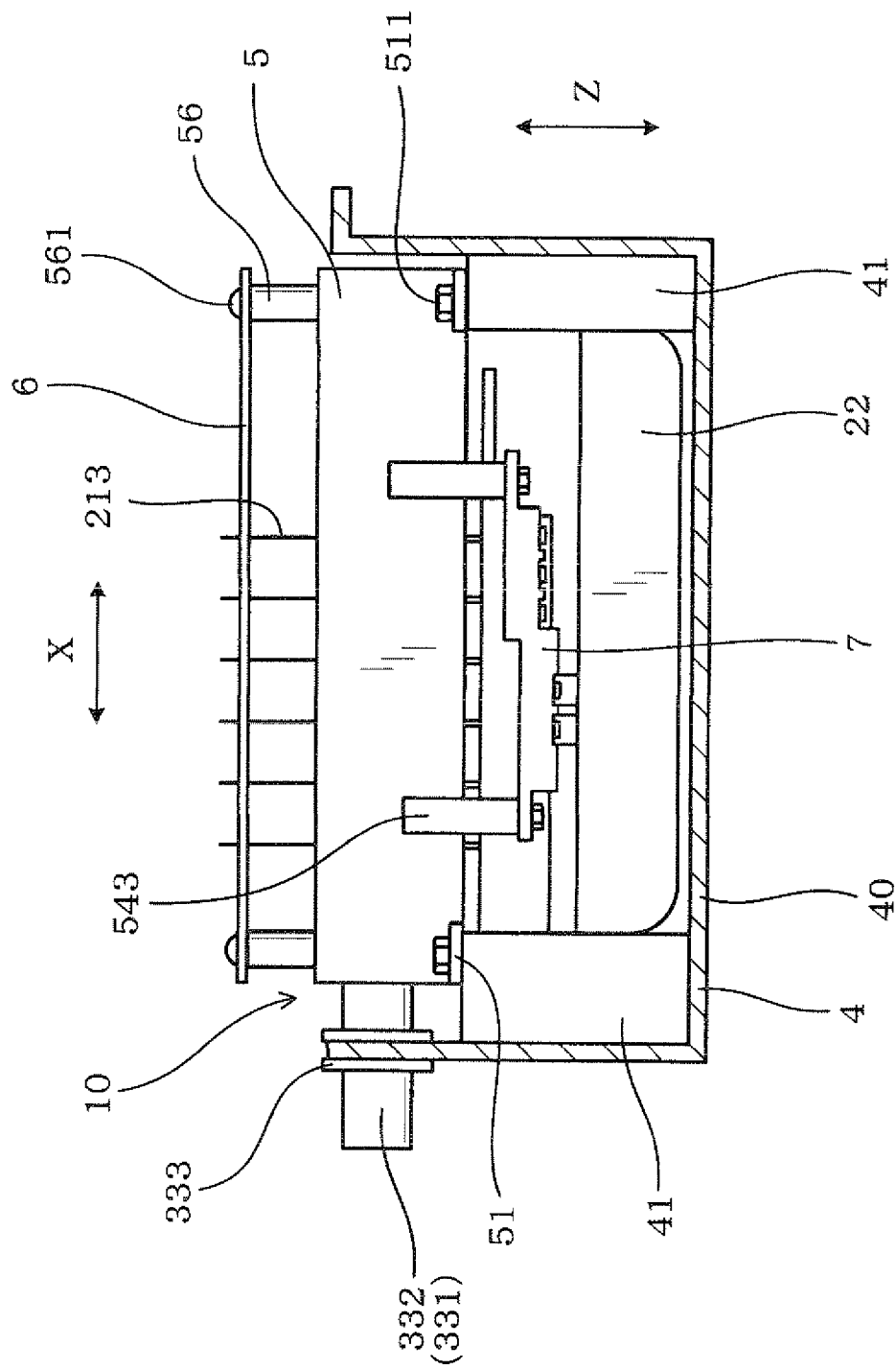
FIG. 18 is a cross-sectional view of FIG. 16 along the line G-G.

As shown in FIGS. 16 to 18, the internal unit 10 is fixed to the case 4 through the frame 5. The frame 5 is made of a conductive material, and formed in a shape to accommodate therein the semiconductor modules 21 constituting the internal unit 10. The frame 5 may be a shaped body of metal such as aluminum or steel, or alloy. Also, the case 4 may be a shaped body of metal such as aluminum or steel or alloy.

As shown in FIGS. 11 to 15, the frame 5 includes a terminal block 7 on which input/output terminals 71 for input and output of controlled electric power are mounted, for making connection between the input/output terminals 71 and external devices such as a DC battery and a three-phase electric rotating machine.

Each of the semiconductor modules 21 incorporates therein switching elements such as IGBTs or MOSFETs. The semiconductor modules 21 are each constituted of a main body section 211 in which the switching elements are resin-molded, main electrode terminals 212 and control terminals 213. The main electrode terminals 212 and the control terminals 213 extend from the main body section 211 in the opposite directions. Controlled electric power is inputted to or outputted from each of the semiconductor modules 212 through the main electrode terminals 212. A control current to control the switching elements is inputted to each of the semiconductor modules 212 through the control terminals 213.

Figure 7:
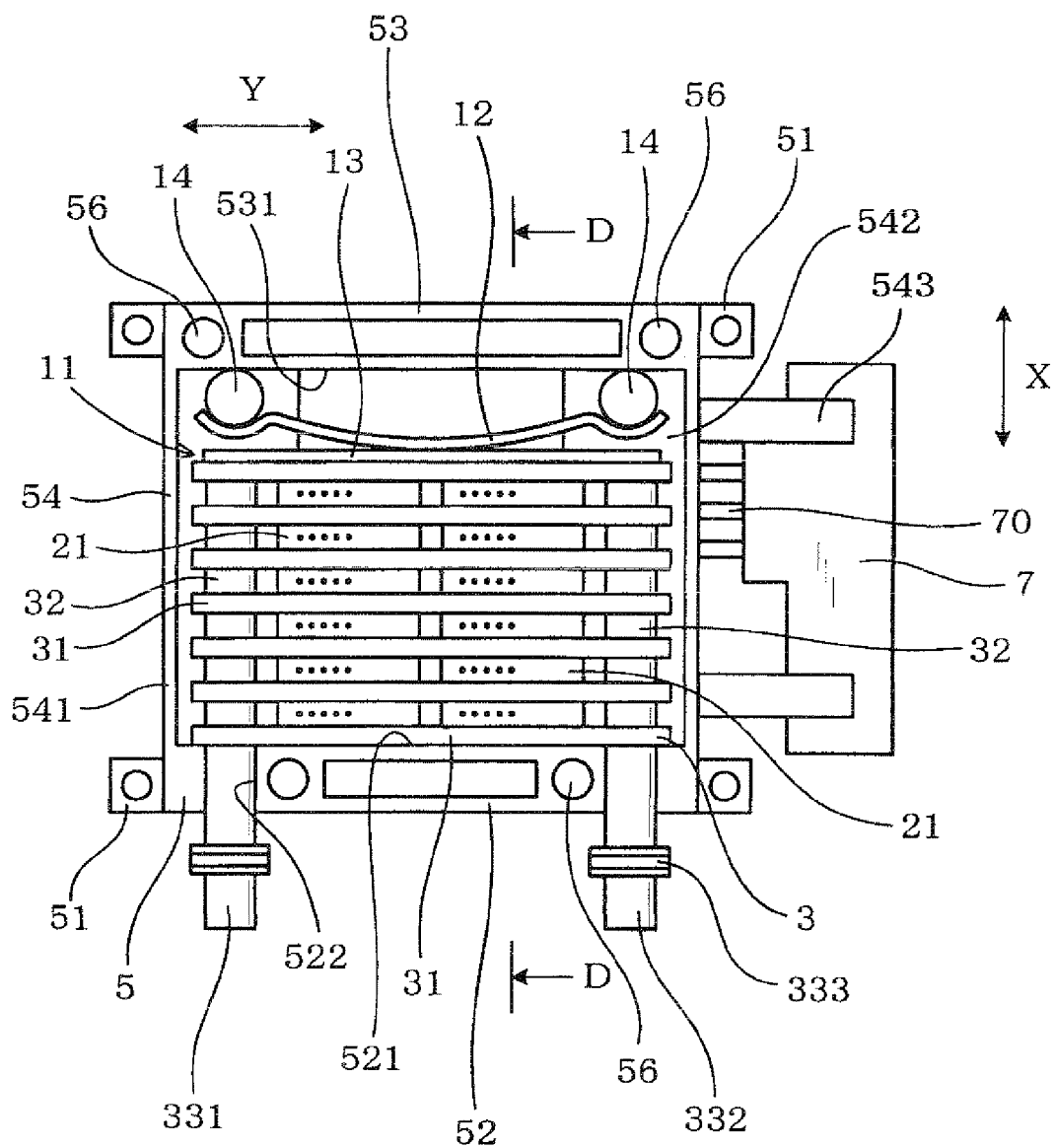
FIG. 7 is a plan view of the frame of the first embodiment, on which a stacked body, a terminal block and so forth are assembled.
Figure 10:
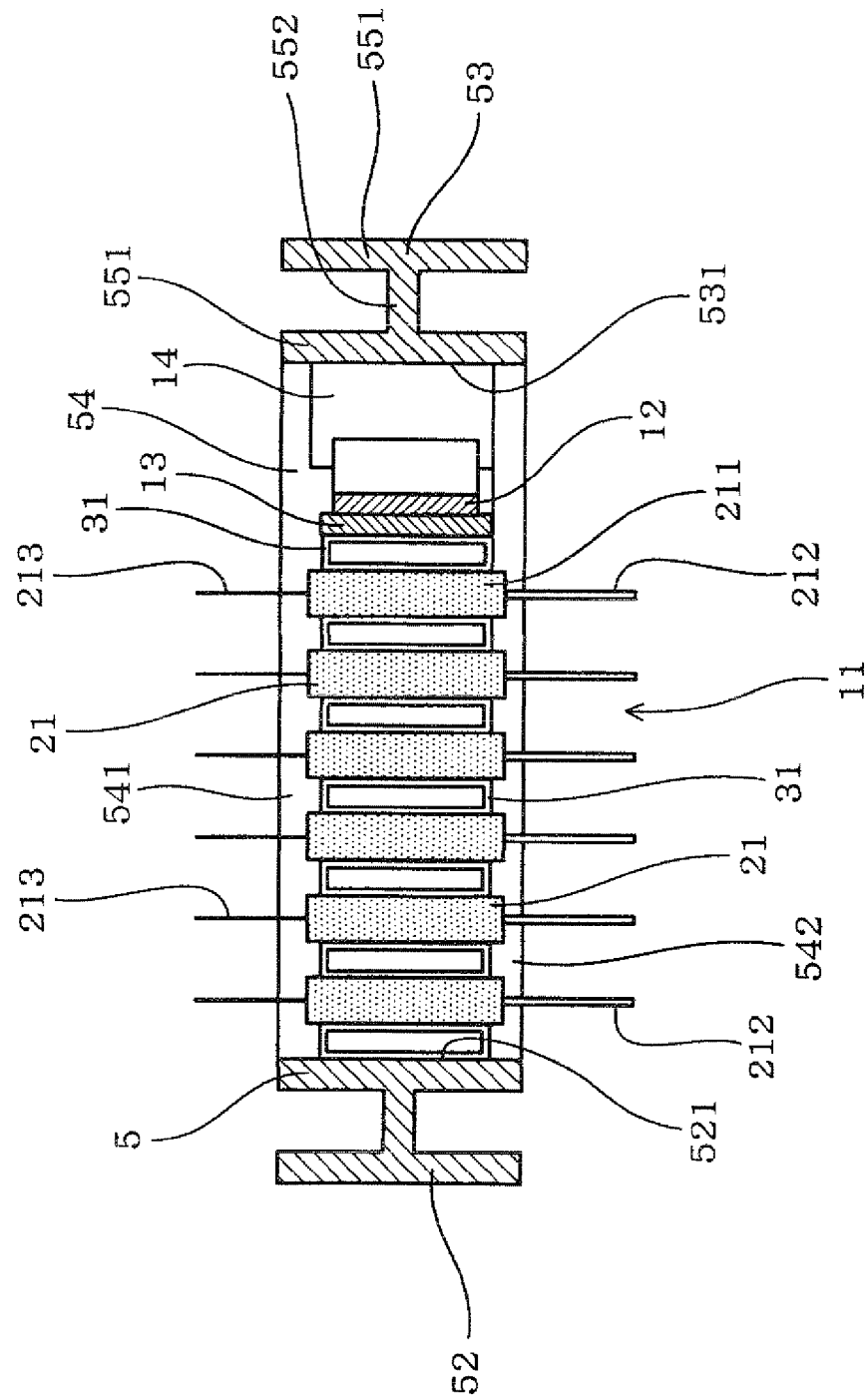
FIG. 10 is a cross-sectional view of FIG. 7 along the line D-D.

As shown in FIGS. 7 and 10, the cooler 3 includes cooling tubes 31 each having therein a coolant passage. The internal unit 10 incorporates therein a stacked body 11 in which the cooling tubes 31 and the semiconductor modules 21 are stacked alternately. The cooling tubes 31 and the semiconductor modules 21 are stacked alternately in the stacked body 11 in a stacking direction X parallel to the plane of the frame 5. Each of the semiconductor modules 21 is held between the cooling tubes 31 at both major surfaces thereof. Between each adjacent two of the cooling tubes 31, two semiconductor modules 21 are disposed.

As shown in FIG. 7, the cooling tubes 31 extend in their longitudinal direction (may be referred to as "the lateral direction Y" hereinafter) perpendicular to the stacking direction X. Each adjacent two of the cooling tubes 31 are joined through a deformable joint tube 32 at their both ends. The cooler 3 includes a coolant introduction tube 331 connected to one end in the lateral direction Y of the cooling tube 31 located at one end in the stacking direction X of the stacked body 11, and a coolant discharge tube 332 connected to the cooling tube 31 located at the other end in the stacking direction X of the stacked body 11.

Accordingly, the coolant introduced from the coolant introduction tube 331 spreads in the longitudinal direction (the lateral direction Y), while passing the joint tubes 32 to be distributed to the respective cooling tubes 31. The coolant exchanges heat with the semiconductor modules 21 while flowing through the respective cooling tubes 31. The coolant having a temperature increased by the heat exchange passes the joint tubes 32 on the downstream side, and is discharged from the coolant discharge tube 332.

As the coolant, there may be used a natural coolant such as water and ammonia, or water mixed with refrigerant such as ethylene glycol, or a fluorocarbon coolant such as fluorinert, or a chlorofluocarbon coolant such as HCFC123 and HFC134a, or an alcoholic coolant such as methanol and alcohol, or a ketone coolant such as acetone.

The internal unit 10 includes a pressure member 12 for pressing the stacked body 11 in the stacking direction X. The pressure member 12 is interposed between an inner part of the frame 5 and one end of the stacked body 11 (this one end being referred to as "rear end" hereinafter) in the stacking direction X. The stacked body 11 is supported by another inner part of the frame at the other end thereof (referred to as "front end" hereinafter).

The pressure member 12 is constituted of a leaf spring which bents convexly toward the stacked body 11. Between the pressure member 12 and the stacked body 11, a flat reinforcing plate 13 is interposed to prevent the pressing force of the pressure member 12 from being locally applied to the cooling tube 31 located at the rear end to thereby prevent this cooling tube 31 from being deformed. A support pin 14 is held between each of both ends of the pressure member 12 in the lateral direction Y and the frame 5. The pressure member 12 is supported by the pair of the support pins 14 at its rear side.

The frame 5 includes a front wall section 52 and a rear wall section 53 located on both sides of the stacked body 11 in the stacking direction X, and a pair of side wall sections 54 joining the front and rear wall sections 52 and 53 at their both ends. Hence, as shown in FIGS. 2 and 3, the frame 5 has a substantially rectangular shape when viewed from the direction perpendicular to both the stacking direction X and the lateral direction Y (referred to as "height direction Z" hereinafter).

As show in FIGS. 1 to 3 and 19, the frame 5 includes unit fixing sections 51 for fixing the internal unit 10 to the case 4. Two of the unit fixing sections 51 are disposed on one side of the stacking direction X, the other two of them are disposed on the other side of the stacking direction X. These four unit fixing sections 5 are located more outward in the stacking direction X than the pair of the supporting portions of the frame 5 (the inner surface 521 of the front wall section 52 and the inner surface 531 of the rear wall section 531) applied with the reaction force toward outside in the stacking direction X from the stacked body 11 and the pressure member 12. In this embodiment, two unit fixing sections 51 are located on the outside of the inner surface 521, and another two unit fixing sections 51 are located on the outside of the inner surface 531.

Each unit fixing section 51 is shaped to project outward from the frame 5 and is formed with a through hole. By inserting a bolt 511 into the through hole, and screwing the bolt 511 into a threaded hole formed in a corresponding one of unit support sections 41 formed inside the case 4 for each of unit fixing sections 51 formed inside the case 4, the frame 5 can be fixed to the case 4 to thereby fix the internal unit 10 to the case 4.

Figure 2:
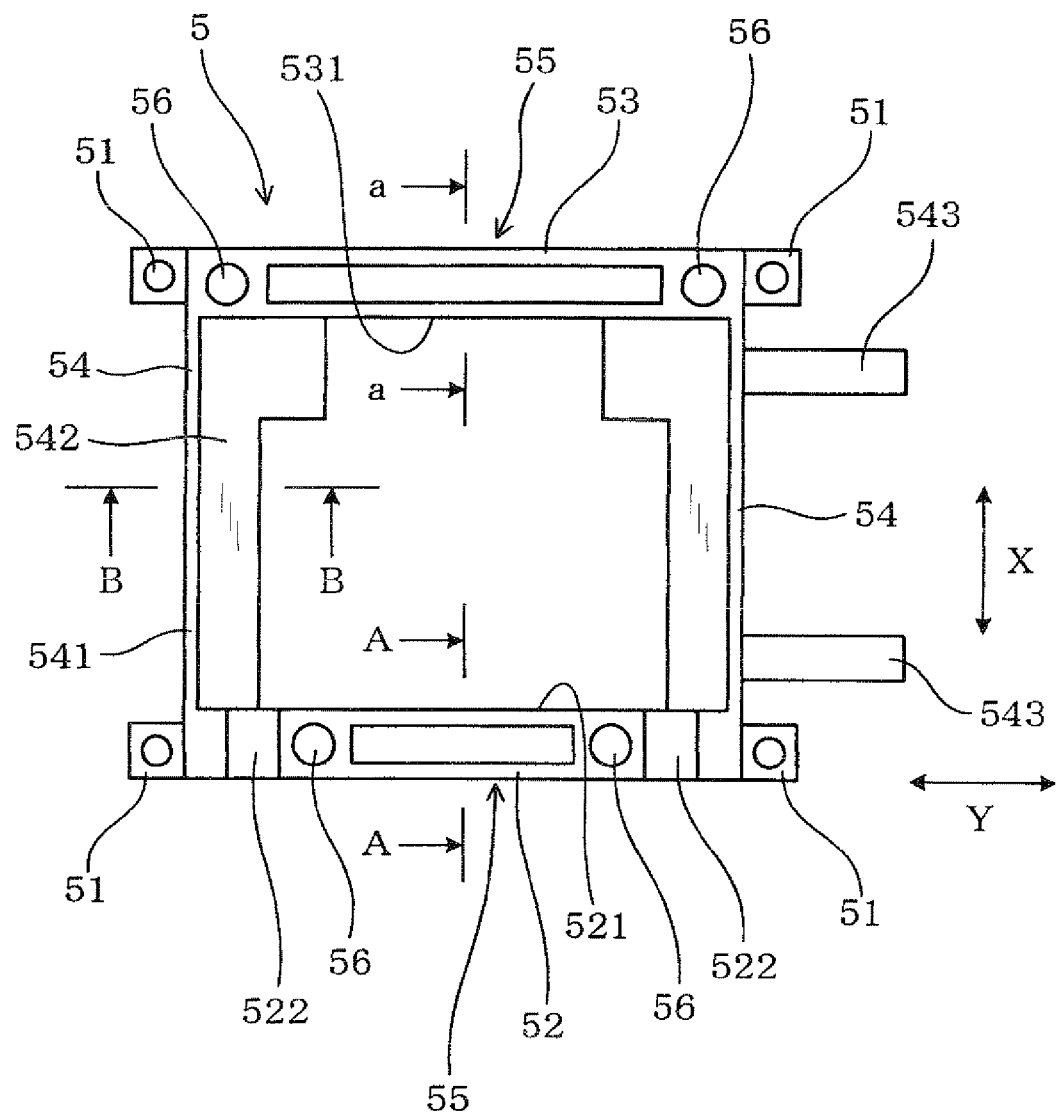
FIG. 2 is a plan view of a frame of the first embodiment.
Figure 3:
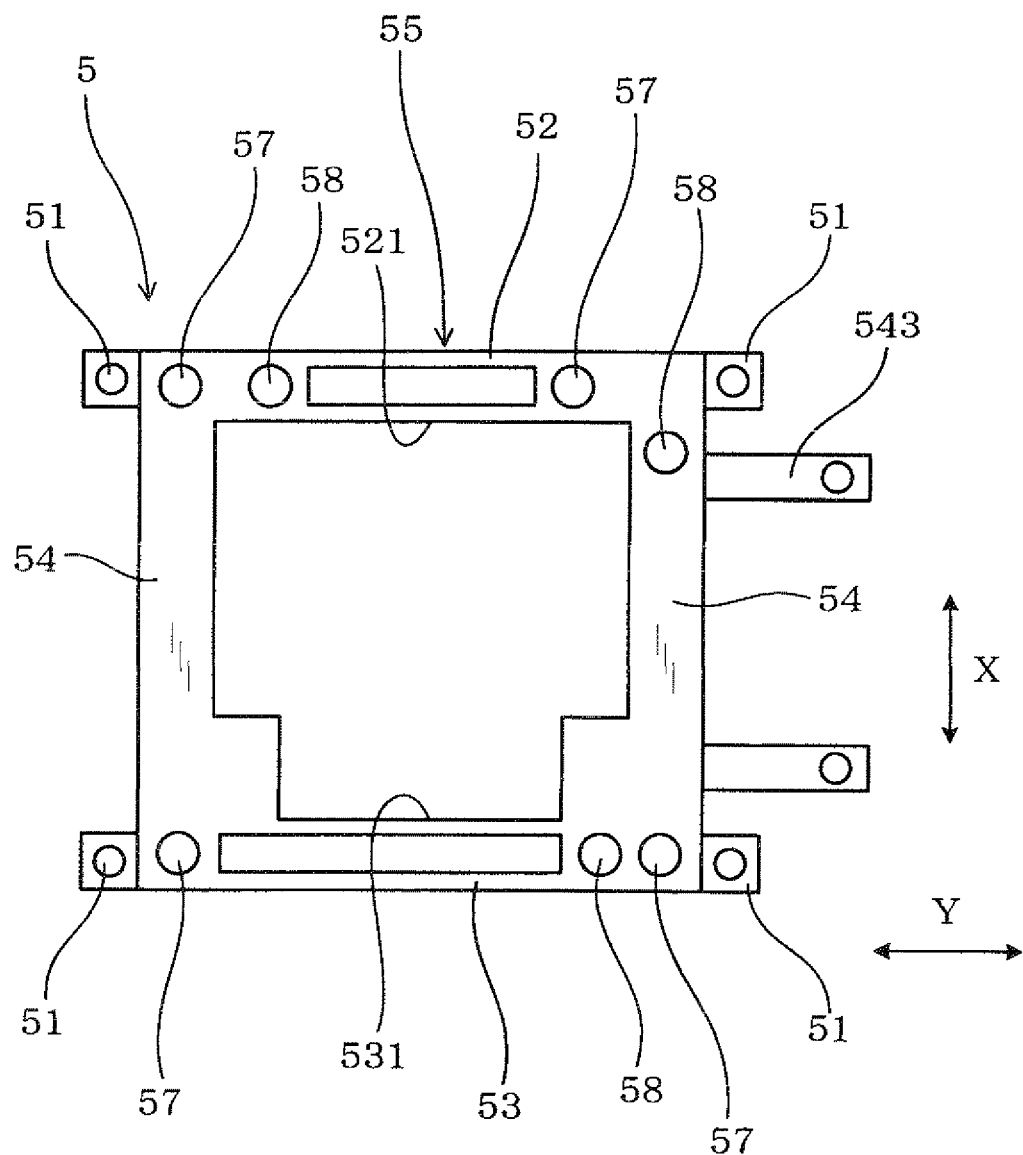
FIG. 3 is a bottom view of the frame of the first embodiment.
Figure 4:
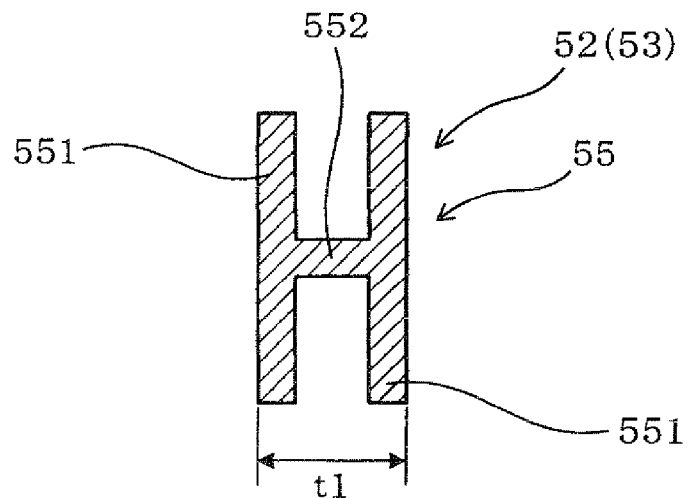
FIG. 4 is a cross-sectional view of FIG. 2 along the line A-A (or a-a)
Figure 5:
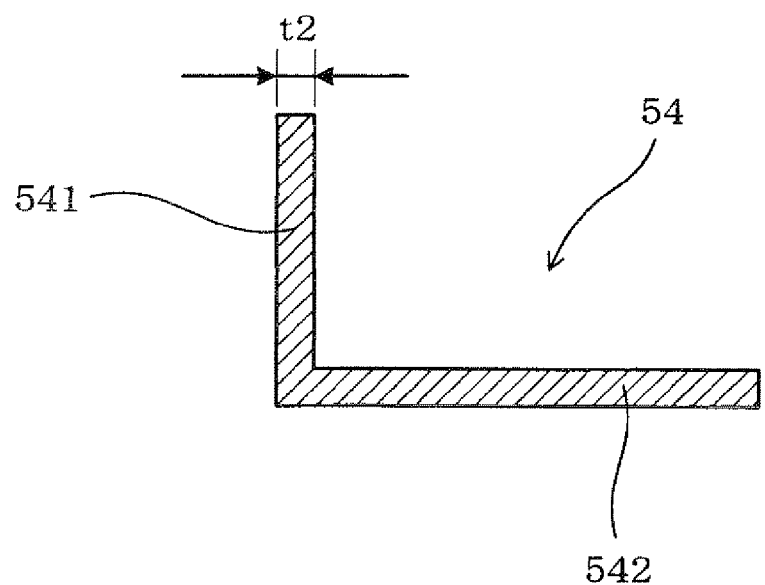
FIG. 5 is a cross-sectional view of FIG. 2 along the line B-B.
Figure 6:
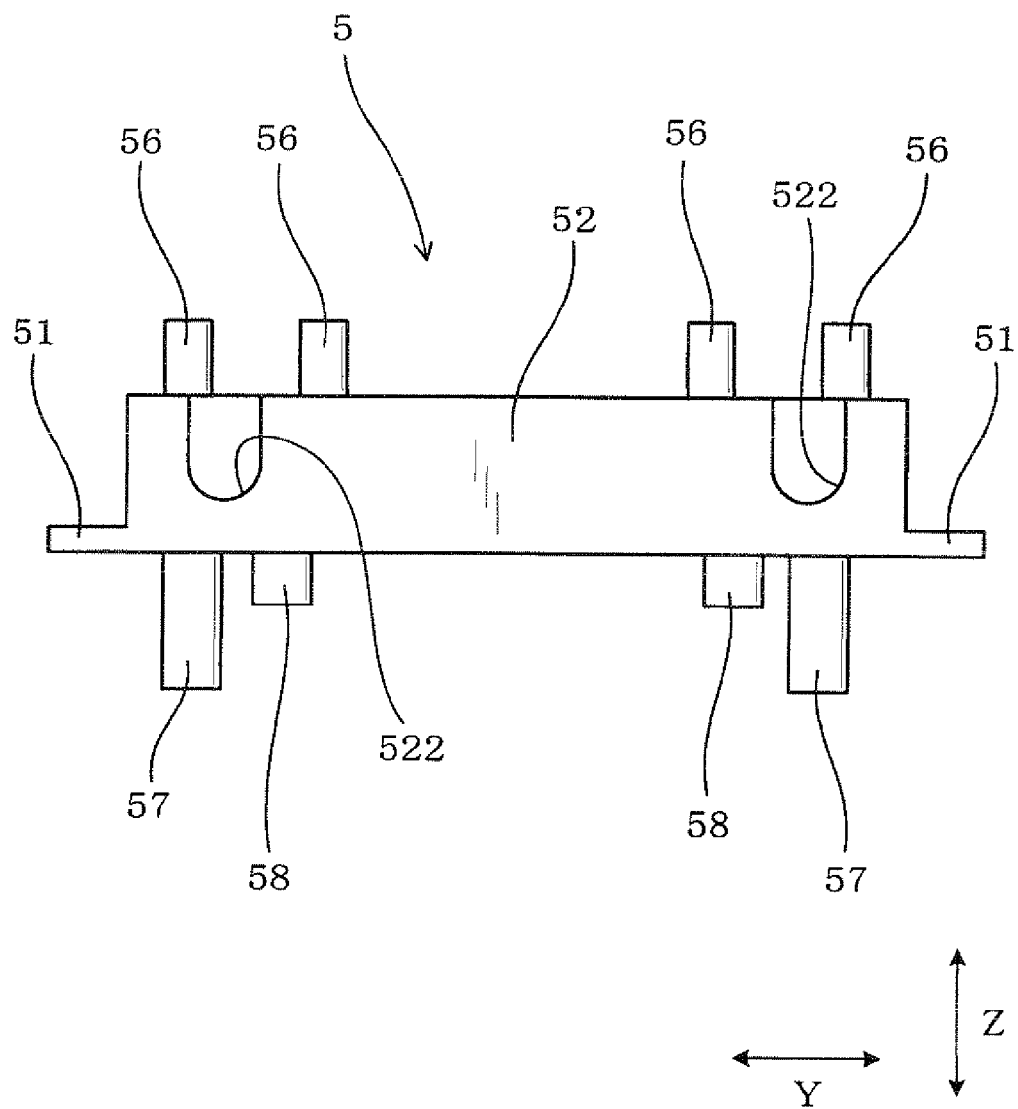
FIG. 6 is a front view of the frame of the first embodiment.

As shown in FIGS. 2, 4 and 5, the wall thickness t1 of the front wall section 52 and the rear wall section 53 are larger than the wall thickness t2 of the side wall sections 54. Here, the wall thicknesses t1 and t2 are dimensions in the stacking direction X or lateral direction Y at portions to which the cooling tubes 30 are projected in the stacking direction X or lateral direction Y.

As shown in FIGS. 4 and 10, at least a part of each of the front wall section 52 and the rear wall section 53 forms an H-shaped wall section 55 having a roughly H-shaped cross section. The H-shaped wall section 55 is constituted of a pair of longitudinal plate sections 551 perpendicular to the stacking direction X, and a connecting section 552 connecting these longitudinal plate sections 551 together.

As shown in FIGS. 2 and 3, at least a part of each of the side wall sections 54 forms an L-shaped wall section having a roughly L-shaped cross section. As shown in FIG. 5, the L-shaped wall section is constituted of a main wall portion 541 having a major surface facing the inner surface of the frame 5, and an inward portion 542 projecting toward the inner side of the frame 5 from one end of the main wall portion 541 in the direction perpendicular to the stacking direction X. In this embodiment, the L-shaped wall section is formed by the whole of the side wall section 54. As shown in FIGS. 2 and 7, the inward portion 542 of the side wall section 54 projects more inward in the vicinity of the support pin 14 than the other portion.

Figure 9:
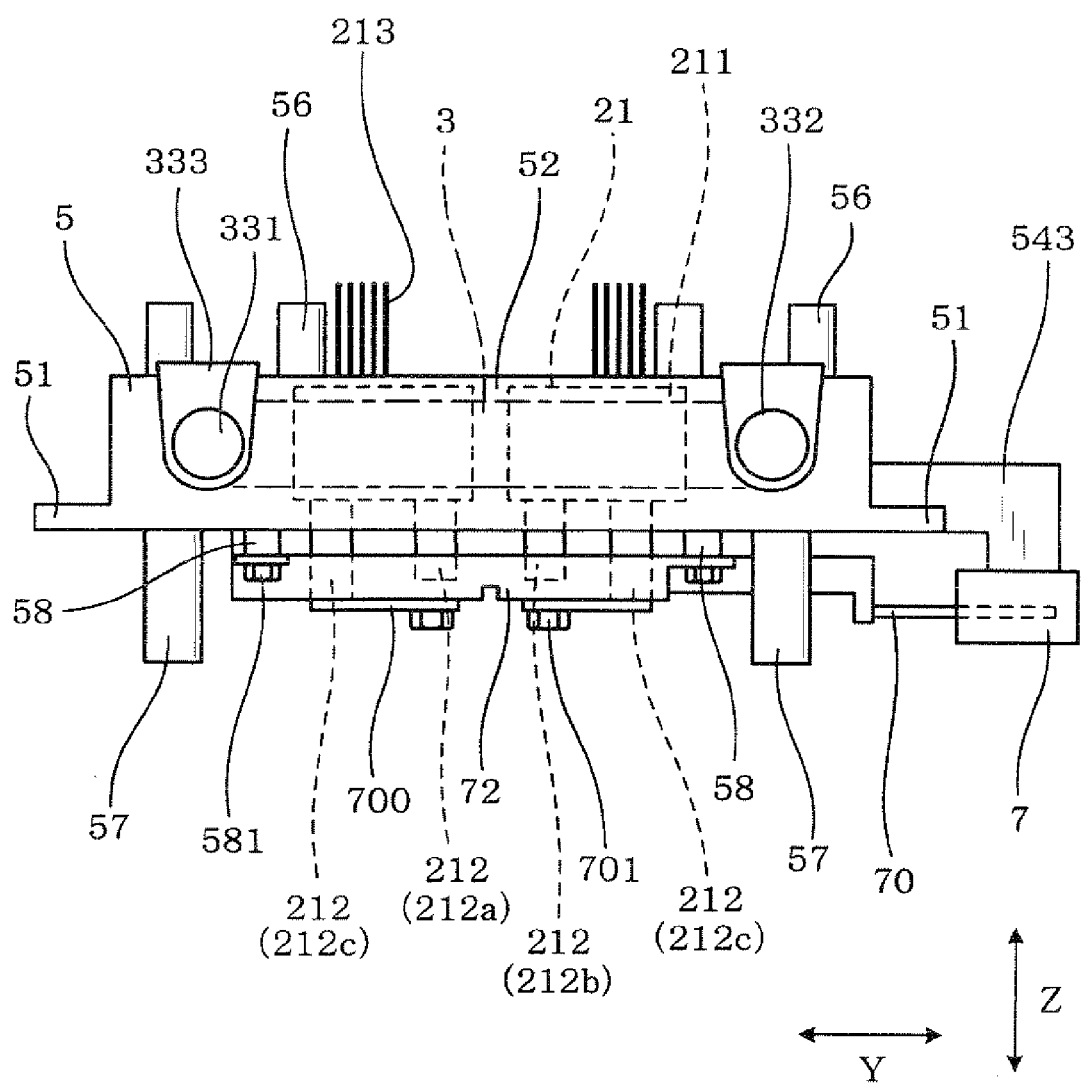
FIG. 9 is a view of the frame as viewed from the direction of the arrow C of FIG. 8.

The frame 5 is open at both sides in the height direction Z. As shown in FIGS. 9 and 10, the main electrode terminals 212 and the control terminals 213 of each semiconductor module 21 respectively project to one side (top side) of the height direction Z and the other side (bottom side) of the height direction Z. In the present application, the description is made assuming that the bottom side of the height direction Z corresponds to the direction of projection of the main electrode terminals 212, and the top side of the height direction Z corresponds to the direction of projection of the control terminals 213. However, this assumption is just for explanation. Likewise, the words "front", "rear", "lateral" are also just for explanation.

Figure 13:
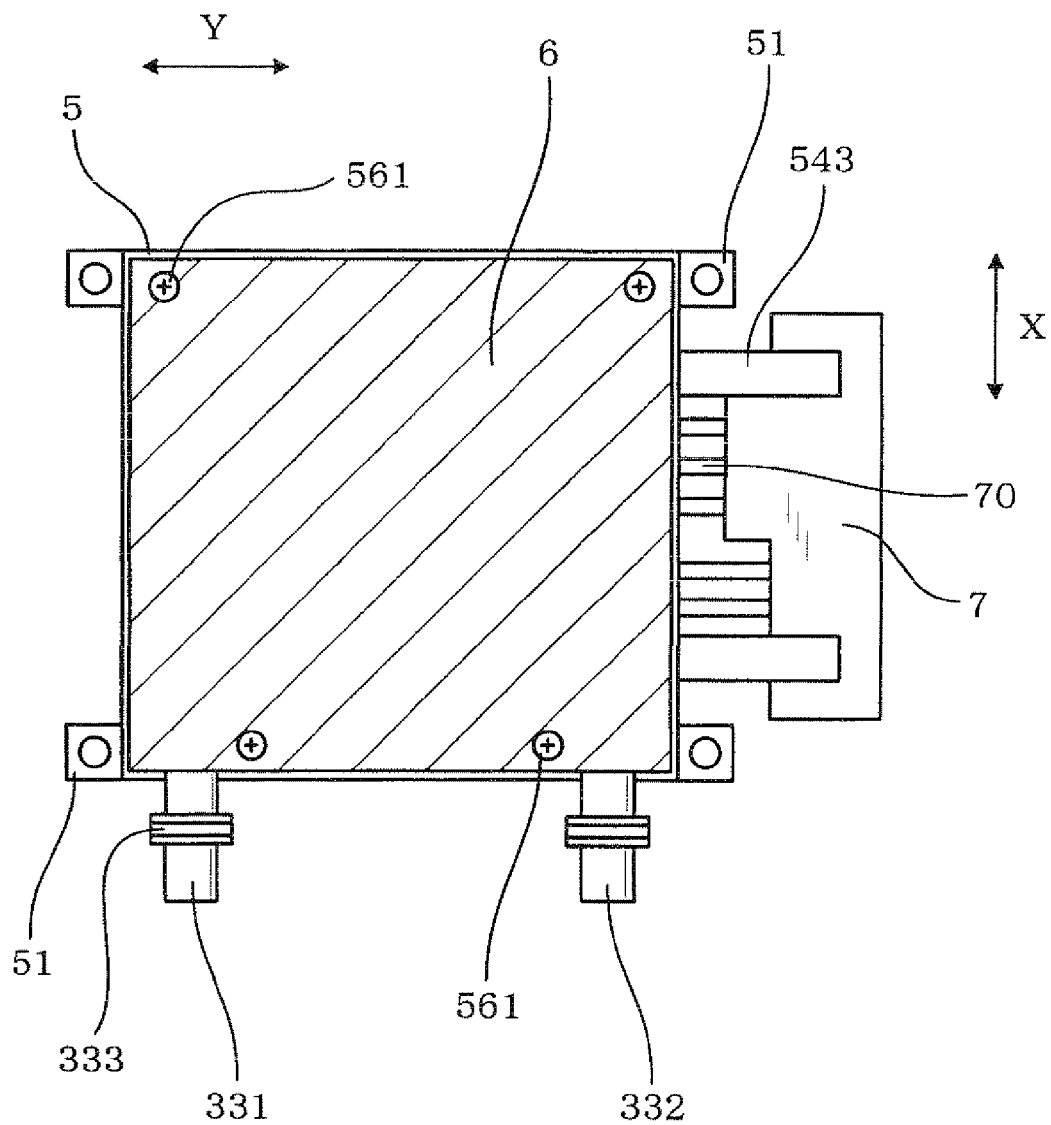
FIG. 13 is a plan view of the frame of the first embodiment, on which a control circuit board is further assembled, that is, a plan view of an internal unit of the first embodiment.
Figure 14:
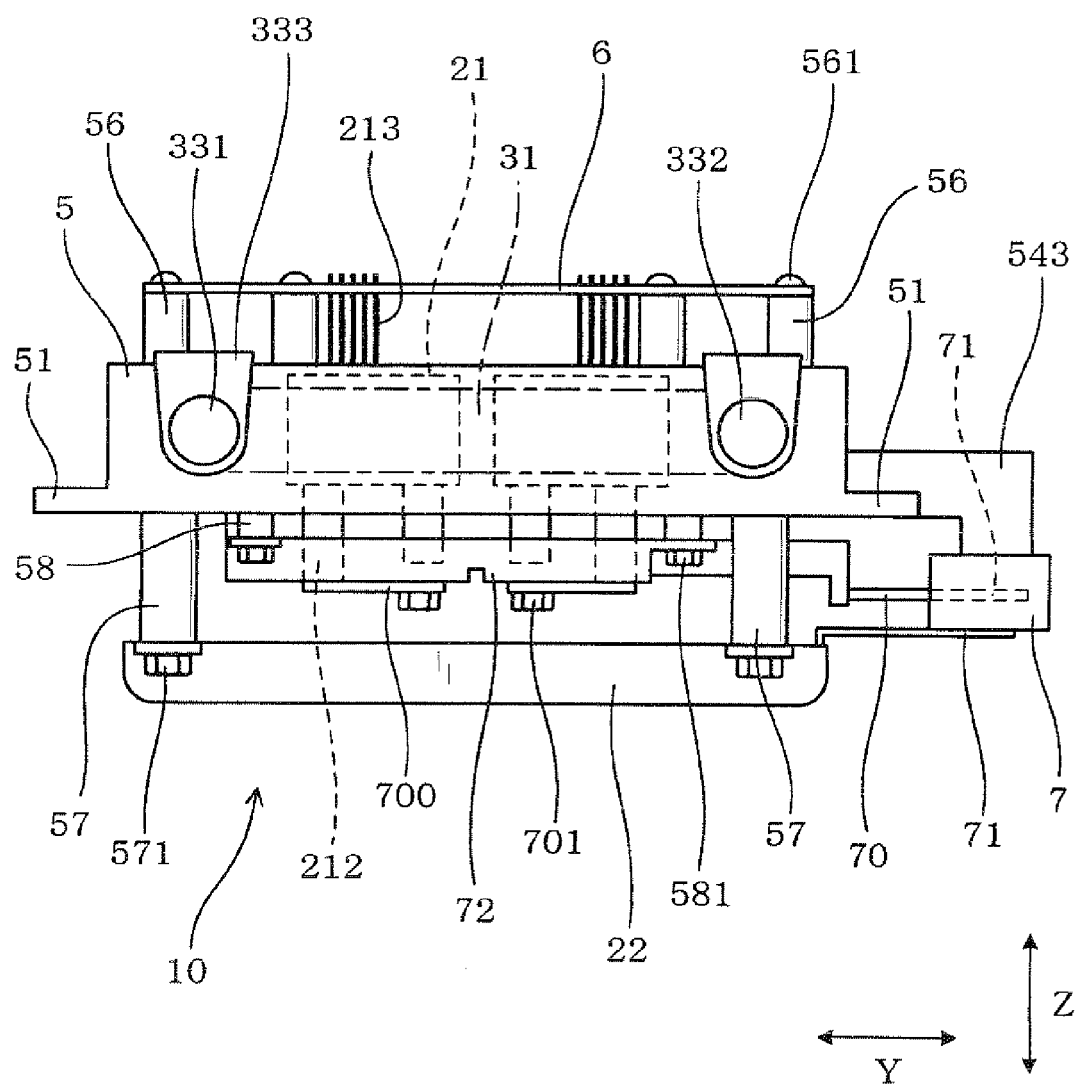
FIG. 14 is a front view of the internal unit of the first embodiment.

As shown in FIGS. 1 and 13 to 19, the internal unit 10 includes a control circuit board 6 on which a control circuit for controlling the switching elements included in the semiconductor modules 21 is formed. The control terminals 213 of the semiconductor modules 21 are connected to the control circuit board 6. As shown in FIGS. 13 and 14, the unit fixing sections 51 of the frame 5 are located more outward than the outer edge of the control circuit board 6.

Figure 15:
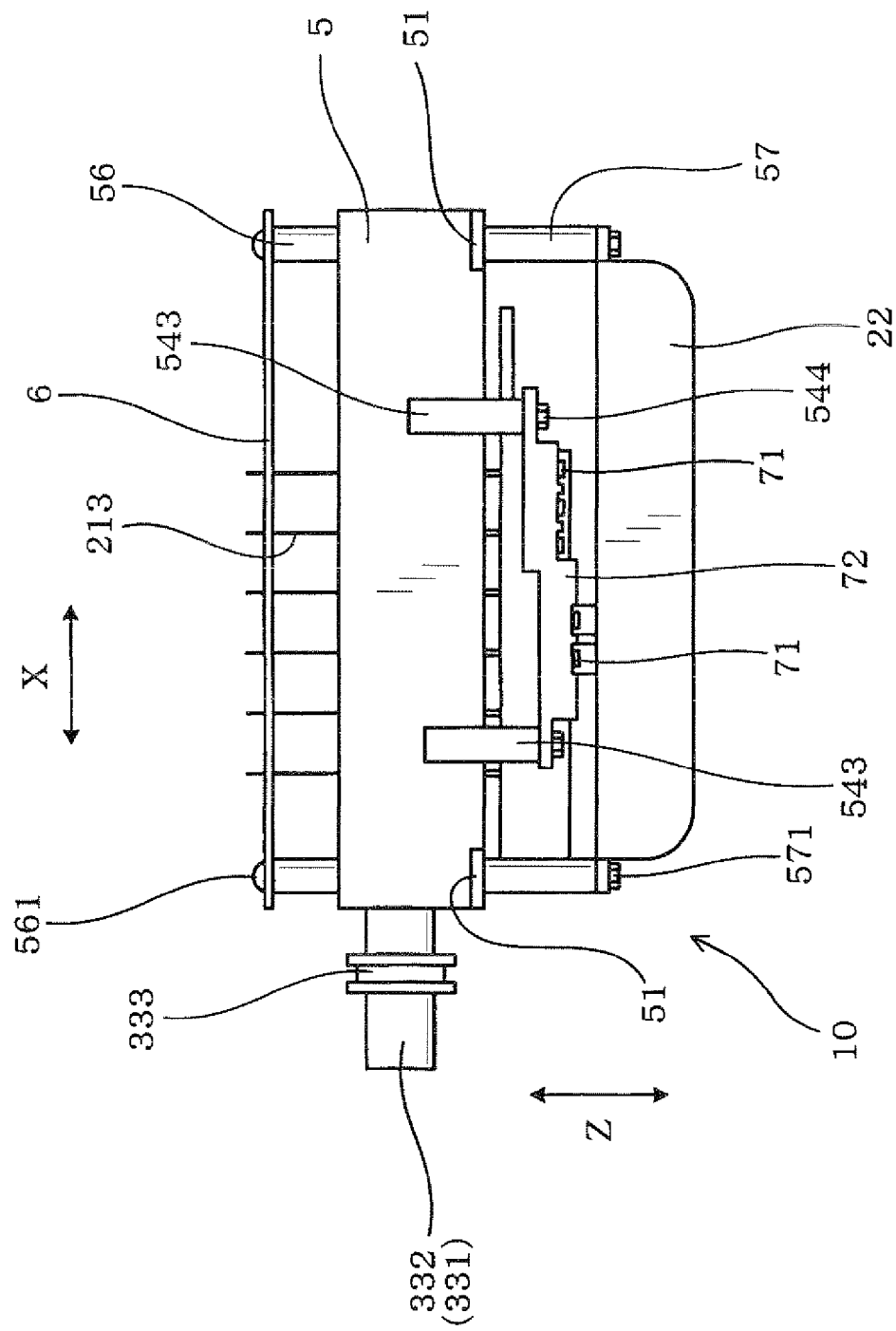
FIG. 15 is a side view of the internal unit of the first embodiment.

As shown in FIGS. 2, 14 and 15, the frame 5 is provided with four board fixing sections 56 for fixing the control circuit board 6 to the internal unit 10, which are located more inward than the unit fixing sections 51. The board fixing sections 56 are constituted of two bosses formed in each of the front wall section 52 and the rear wall section 53 so as to project upward in the height direction Z. As shown in FIGS. 13 to 15, each of the board fixing sections 56 is formed with a threaded hole in which a screw 561 is inserted to secure the control circuit board 56 to the frame 5 in four positions.

As shown in FIGS. 14 and 15, the internal unit 10 includes a capacitor 22. The frame 5 includes four capacitor fixing sections 57 for fixing the capacitor 22 to the internal unit 10.

Figure 11:
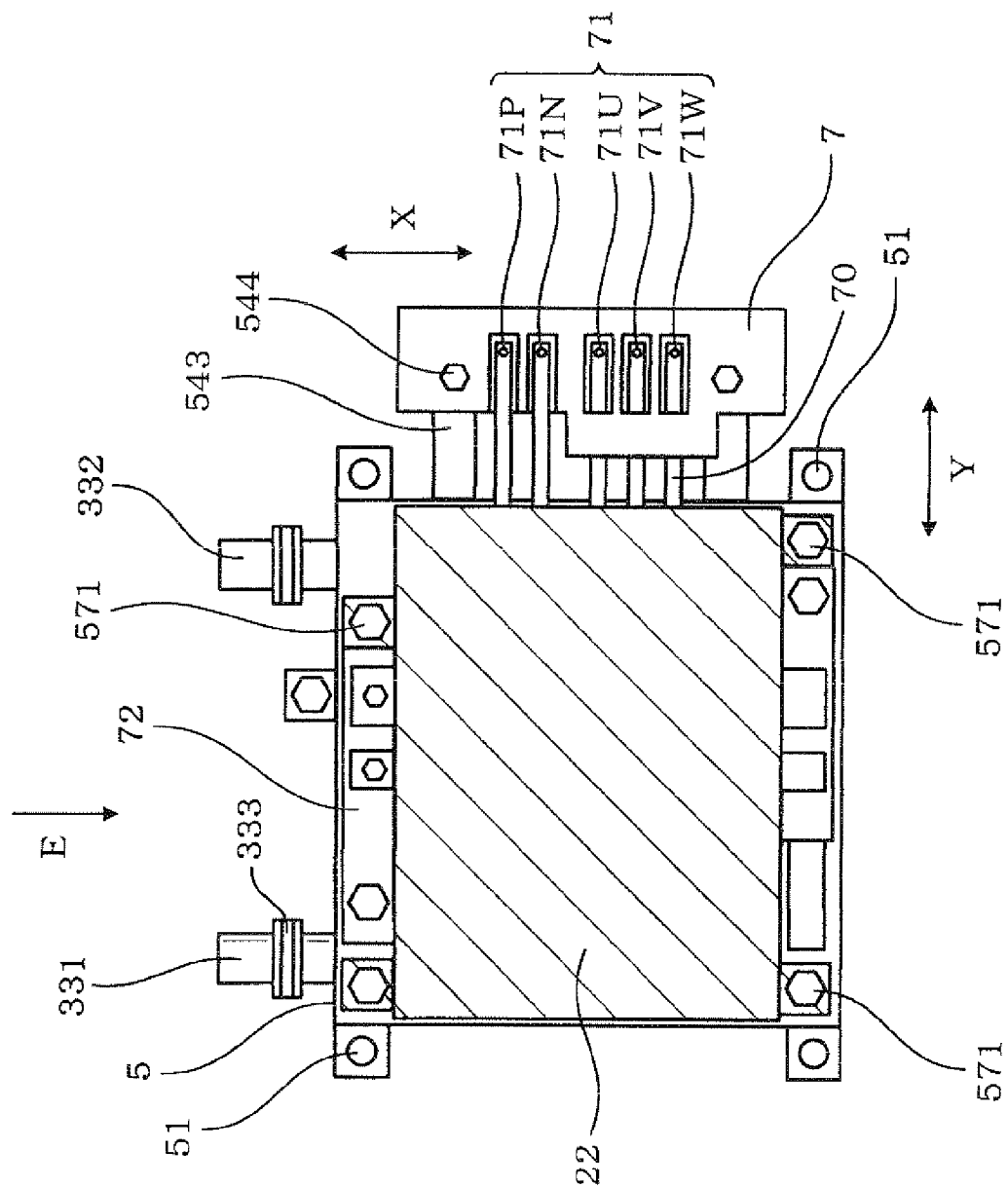
FIG. 11 is a plan view of the frame of the first embodiment, on which a capacitor is further assembled.

As shown in FIGS. 3, 11 and 14, the capacitor fixing sections 57 are located more inward than the unit fixing sections 51. The capacitor fixing sections 57 are constituted of two bosses formed in each of the front wall section 52 and the rear wall section 53 so as to project to the opposite side of the board fixing sections 56, that is, downward in the height direction Z. Each of the capacitor fixing sections 57 is formed with a threaded hole into which a bolt 571 is inserted to secure the capacitor 22 to the frame 5 in four positions.

Figure 8:
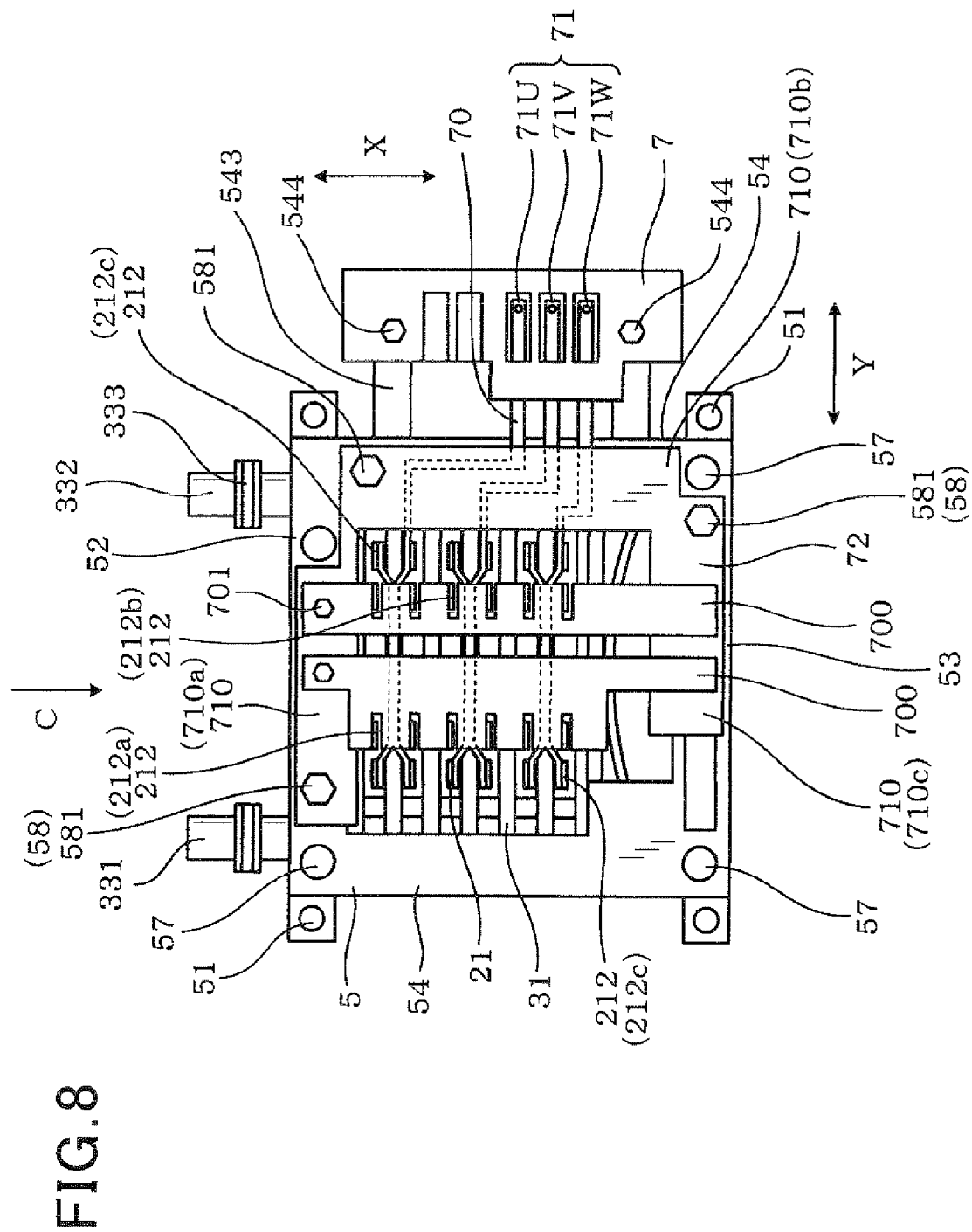
FIG. 8 is a plan view of the frame of the first embodiment, on which a bus bar assembly is further assembled.

As described in the foregoing, the internal unit 10 includes also the terminal block 7 (see FIGS. 11 to 15). The terminal block 7 is fixed to two support arms 543 by bolts (terminal block fixing sections) 544, the support arms 543 being formed in one of the side wall sections 54 so as to project outward. As shown in FIG. 8, the terminal block 7 is disposed adjacent to the one of the side wall sections 54.

The input/output terminals 71 include a pair of capacitor terminals 71P and 71N electrically connected to a pair of electrodes of the capacitor 22, and three output terminals 71U, 71V and 71W electrically connected to the main electrode terminals 212 of the semiconductor modules 21 and to be respectively connected to the U-phase, V-phase and W-phase of the three-phase electric rotating machine. The input/output terminals 71 are respectively formed at one ends of bus bars which are connected to the capacitor 22 or semiconductor modules 21 at the other ends thereof.

As shown in FIG. 8, the frame 5 is provided with a bus bar assembly 72 constituted of three bus bars respectively formed with input/output terminals 71U, 71V and 71W, and a bus bar holding section 710 made of an insulation material such as synthetic resin for holding the bus bars 70. The bus bar holding section 710 is constituted of a first portion 710a disposed on the front wall section 52 and extending in the lateral direction Y, a second portion 710b disposed on one of the side wall sections 54 and extending in the stacking direction X, and a third portion 710c disposed on the rear wall section 53 and extending in the lateral direction Y. The bus bar assembly 72 is fixed to the frame 5 through the bus bar holding section 710. Each of the bus bars 70 is bent at a right angle at a plurality of positions. The bent portions of the bus bars 70 are sealed in the second portion 710b of the bus bar holding section 710. As described in the foregoing, the end of each of the bus bars 70 is formed with the input/out terminal 71. The bus bars 70 branch within the case 5 to be connected to the main electrode terminals 212 (more precisely, AC terminals 212c explained later) of the semiconductor modules 21.

As shown in FIGS. 3, 14 and 15, the frame 5 includes bus bar fixing sections 58 for fixing the bas bar assembly 72. In this embodiment, the bus bar fixing sections 58 are formed in three positions. Two of the three bas bar fixing sections 58 are located at positions closer to the terminal block 7 than to the center of the frame 5. The bus bar holding section 710 is formed with through holes (see FIG. 8) through which bolts 581 are inserted to screw the bus bar holding section 710 to the bus bar fixing sections 58 to thereby fix the bus bar assembly 72 to the frame 5.

As described in the foregoing, the semiconductor modules 21 are each constituted of the main body section 211 (see FIG. 9) incorporating therein the switching elements, and main electrode terminals 212 and control terminals 213 extending from the main body section 211 in the opposite directions. The main electrode terminals 212 includes positive electrode terminals 212a to be connected to positive electrodes of a DC power source (not shown), negative electrode terminals 212b to be connected to negative terminals of the DC power source, and negative electrode terminals 212c to be connected to an AC load. The positive and negative electrode terminals 212a and 212b are connected to the bus bars 700 (see FIG. 8). The AC terminals 212c are connected to the bus bars 70. The bus bars 70 are formed with the input/output terminals 71 at their ends. The input/output terminals 71 extend in the longitudinal direction (the lateral direction Y) of the cooling tubes 31.

The internal unit 10 includes all the electronic components constituting the power conversion circuit. That is, all the electronic components of the power conversion apparatus 1 belong to the internal unit 10, and none of the electronic components is directly fixed to the case 4. As shown in FIG. 1, the case 4 is constituted of a case body 40 which is open upward, and a lid body 400 closing the opening of the case body 40. The unit support sections 41 are formed integrally with the case body 40.

The case body 40 is provided with a flange section 42 around the outer periphery of its opening. Also, the lid body 400 is provided with a flange section 420 around the outer periphery thereof. The case body 40 and the lid body 400 are joined together with a seal member (not shown) interposed between their flange sections 42 and 420 by bolts 431 and nuts 432. Accordingly, the internal unit 10 is sealingly enclosed in the case 4.

Figure 19:
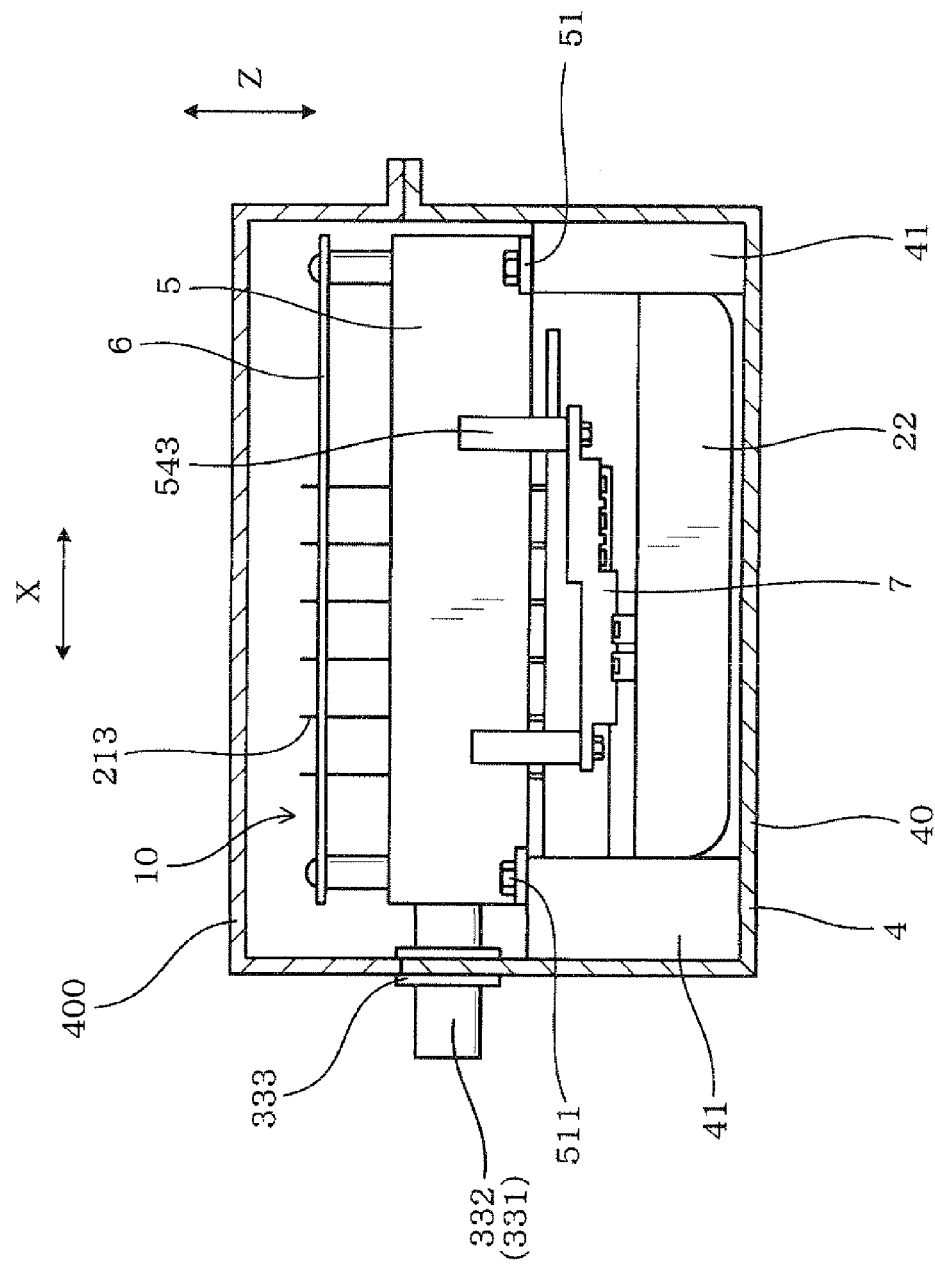
FIG. 19 is a cross-sectional view of the power conversion apparatus according to the first embodiment as viewed along the line G-G of FIG. 16.

As shown in FIGS. 16 and 19, each of the coolant introduction tube 331 and the coolant discharge tube 332 is connected to the stacked body 11 (see FIG. 7) so as to partially protrude from the case 4. Each of the coolant introduction tube 331 and the coolant discharge tube 332 is provided with an annular packing 333 at its outer periphery. The case body 40 is formed with two recesses 44 through which the coolant introduction tube 331 and the coolant discharge tube 332 pass, respectively. Each of the annular pickings 333 is held between the case body 40 and the lid body 400 in the state of being fitted to the coolant introduction tube 331 or coolant discharge tube 332 at one of the recesses 44. Accordingly, the case 4 can be hermetically sealed allowing the coolant introduction tube 331 and the coolant discharge tube 332 to protrude outward from the case 4.

The case 4 is further formed with through holes as passages of electric wires and spaces for installing connectors for connection of the electronic components and the control circuit board 6 with external devices. These through holes are provided with seal members to ensure water tightness of the case 4.

To assemble the power conversion apparatus 1 having the above-described structure, the internal unit 10 is assembled first as shown in FIGS. 13 to 15. Next, the internal unit 10 is accommodated and fixed in the case body 40 as shown in FIGS. 16 to 18. Finally, the internal unit 10 is sealingly enclosed in the case 4 by joining the lid body 400 to the case body 40 as shown in FIGS. 1 and 19.

To assemble the internal unit 10, the frame 5 shown in FIGS. 2 to 6 is prepared. Next, the stacked body 11 of the semiconductor modules 21 and the cooling tubes 31 stacked alternately is disposed inside the frame 5 as shown in FIGS. 7 and 10. Incidentally, the cooling tubes 31 are coupled together through the joint tubes 32, and the cooler 33 including the coolant introduction tube 331 and the coolant discharge tube 332 connected thereto is assembled before the above step. When the stacked body 11 is disposed inside the frame 5, the coolant introduction tube 331 and the coolant discharge tube 332 are respectively placed on concave portions 522 formed in the frame (see FIGS. 2 and 6).

The pressure member 12 is disposed between the rear end of the stacked body 11 and the rear wall section 53 of the frame 5. Subsequently, the pressure member 12 is pushed forward at around both ends thereof by a pressure jig while being elastically deformed in the stacking direction X in order to compress the stacked body 11. When the pressure member 12 is deformed by a predetermined amount, the column-shaped support pins 14 are inserted between the rear wall section 53 of the frame 5 and each end of the pressure member 12. Thereafter, the pressure jig is pulled away from the pressure member 12 while being moved backward in order to bring the pair of the support pins 14 to the state of being held between the pressure member 12 and the rear wall section 53. This state is also a state in which the stacked body 11 is compressed in the stacking direction by a predetermined pressure due to an urging force applied from the pressure member 12.

Next, the terminal block 7 is fixed to the support arms 543 of the frame 5 by the bolts (terminal block fixing sections) 544 as shown in FIGS. 7 to 9. Next, the resin-molded bus bar assembly 72 is fixed to the frame 5, and the bus bars 70 are welded to the main electrode terminals 212 of the semiconductor modules 21. Further, the input/output terminals 71U, 71V and 71W formed in the bus bars 70 are placed on the terminal block 7. The bus bar assembly 72 is fixed to bus bar fixing sections 58 formed at three positions in the frame 5 by bolts 581.

Thereafter, the bus bars 700 for connection between the semiconductor modules 21 and the capacitor 22 are welded to the main electrode terminals 212 of the semiconductor modules 21, and fixed to the bus bar assembly 72 by bolts 701.

Figure 12:
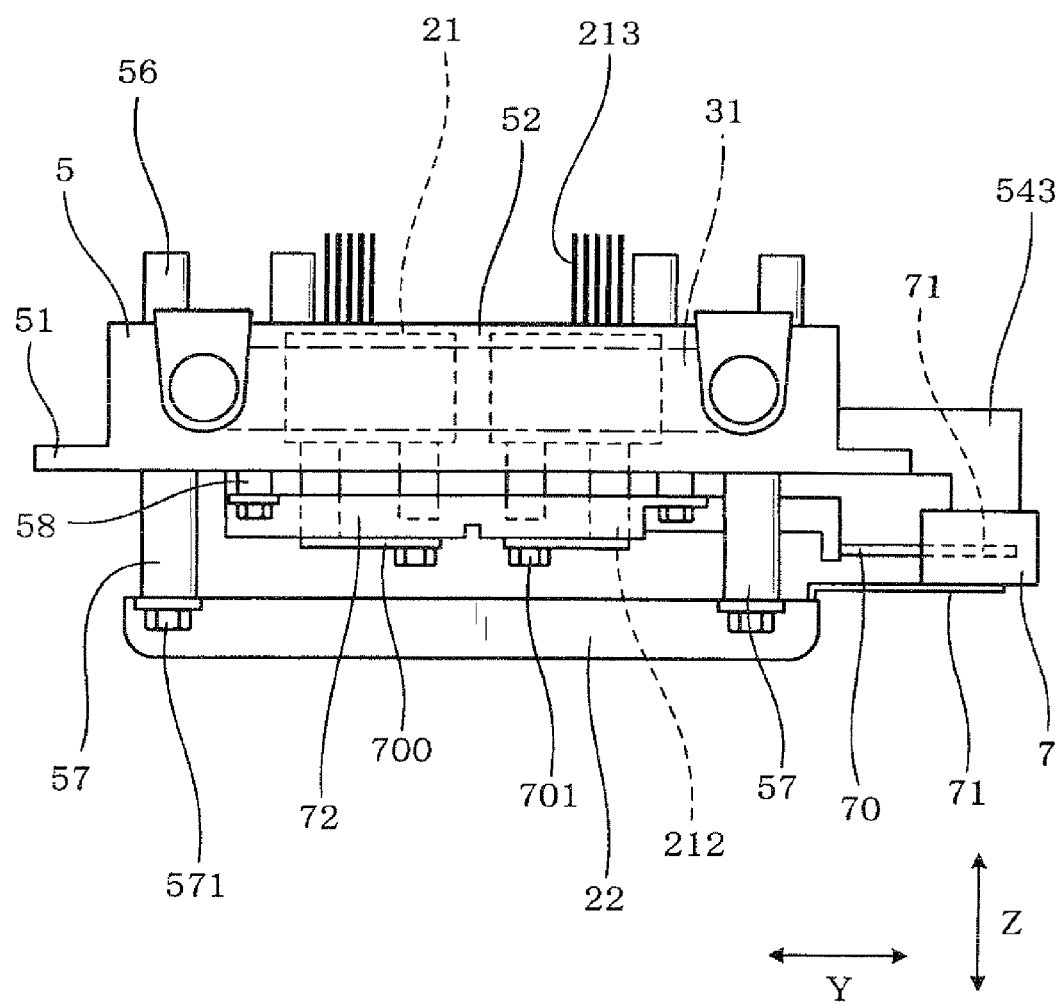
FIG. 12 is a view on the arrow E of FIG. 11.

Next, as shown in FIGS. 11 and 12, the capacitor 22 is fixed to the lower side of the frame 5. More precisely, the capacitor 22 is secured to the capacitor fixing sections 57 provided in the frame 5 by the bolts 571, and the pair of the capacitor terminals 71P and 71N are placed on the terminal block 7.

Next, as shown in FIGS. 13 to 15, the control circuit board 6 is disposed above the frame 5, and the control terminals 213 of the semiconductor modules 21 are inserted and connected into the through holes formed in the control circuit board 6.

Subsequently, the circuit board 6 is fixed to the board fixing sections 56 of the frame 5 by the screws 561. This completes assembly of the internal unit 10.

Thereafter, as shown in FIGS. 16 to 18, the internal unit 10 is fixed to the case body 40. More precisely, the unit fixing sections 51 of the frame 5 which serves as an outer shell of the internal unit 10 are placed on the upper surfaces of the unit support sections 41 formed in the case body 40. At this time, the annular packings 333 attached to the coolant introduction tube 331 and the coolant discharge tube 332 are respectively fitted into the concave portions formed in the case body 40. In this state, the bolts 511 are inserted into the thorough holes formed in the unit fixing sections 51, and screwed into the threaded holes formed in the unit support sections 41 in order to fix the internal unit 10 to the case body 40.

Subsequently, as shown in FIGS. 1 and 19, the lid body 400 is placed on the opening of the case body 40 with the seal member being interposed therebetween, and the lid body 400 and the case body 40 are joined together at their flange sections 42 and 420 by the bolts 431 and the nuts 432. As a result, the internal unit 10 is sealingly enclosed in the case 4. This completes assembly of the power conversion apparatus 1.

In the following, the effects and advantages of this embodiment are explained. The power conversion apparatus 1 has the structure in which the electronic components (the semiconductor modules 21, capacitor 22 and so on) and the cooler 3 are fixed to the frame 5, so that the electronic components, the cooler 3 and the frame 5 are integrated as the internal unit 10. The internal unit 10 is fixed within the case 4. Accordingly, since the internal unit 20 serves as a beam of the case 4, the rigidity of the case 4 can be improved. That is, since the case 4 can have a sufficient rigidity without being increased in the wall thickness, or being provided with reinforcing ribs, it is possible to reduce the material cost and the manufacturing cost of the case 4, and also to reduce the weight of the case 4.

Fixing the internal unit 10 to the case 4 makes it possible to suppress external force applied to the respective electronic components and the cooler 3 included in the internal unit 10 through the case 4. This makes it possible to suppress the electronic components and the cooler 3 included in the internal unit 10 from being affected by external vibration and thermal stress.

The electronic components and other members are not directly fixed to the case 4, but assembled in the internal unit 10 to be fixed to the case 4. Accordingly, assembling work of the power conversion apparatus 1 becomes easy. Also, maintenance of the power conversion apparatus 1 becomes easy, because the whole internal unit 10 can be removed from the case 4 for maintenance work.

Since assembly and maintenance of the power conversion apparatus 1 can be carried out outside the case 4, the case 4 does not have to be provided with two or more lids. Accordingly, the sealing surface between the case body 40 and the lid body 400 can be one in number. This makes it possible to improve the water tightness of the case 4, and to reduce the sealing material of the case 4, to thereby reduce the material cost and man-hour cost for application of the sealing material to the case 4. The internal unit 10 is sealingly enclosed in the case 4. That is, since the whole internal unit 10 including the frame 5 is sealingly enclosed in the case 4, the sealing surface can be one in number.

Since the internal unit 10 is fixed to the frame 5 within the case 4, and serves as a beam of the case 4 as described in the foregoing, the rigidity of the case 4 can be further improved. Since the frame 5 is made of a conductive material, and is shaped to incorporate therein the semiconductor modules 21, it can shield electromagnetic noise emitted from the semiconductor modules 21. The case 4 is also made of a conductive material, and accordingly electromagnetic noise emitted from the semiconductor modules 21 can be shielded doubly by the frame 5 and the case 4.

In this embodiment, the assembling work of the terminal block 7 can be performed easily, because the internal unit 10 can be assembled by attaching the terminal block 7 to the frame 5 outside the case 4, and thereafter the internal unit 10 can be fixed to the case 4.

In this embodiment, as shown in FIG. 8, one of the side wall sections 54 is formed with the support arms 543 projecting outward from its outer surface. The terminal block 7 is supported by these support arms 543. This facilitates the step of attaching the terminal block 7 to the frame 5 during manufacture of the power conversion apparatus 1.

As shown in FIGS. 7 and 10, the stacked body 11 in which the cooling tubes 31 and the semiconductor modules 21 are stacked alternately is included in the internal unit 10. Since this makes it possible to assemble the stacked body 11 outside the case 4, the power conversion apparatus 1 can be assembled more easily.

Since the stacked body 11 is constituted of the cooling tubes 31 and the semiconductor modules 21 stacked alternately, the semiconductor modules 21 can be cooled efficiently, and the stacked body 11 can be made compact in size.

As shown in FIG. 8, the input/output terminals 71 extend in the direction perpendicular to the stacking direction X and parallel to the plane of the frame, that is, in the lateral direction Y. Accordingly, the lengths of the input/output terminals 71 can be made nearly the same with one another easily. If the input/output terminals 71 are formed so as to extend in the stacking direction X, their lengths vary greatly from one another depending on their positions with respect to the terminal block 7. Accordingly, in this case, the length of the input/output terminal 71 connected to the semiconductor modules 21 located at positions close to the terminal block 7 becomes short, and the length of the input/output terminal 71 connected to the semiconductor modules 21 located at positions distant from the terminal block 7 becomes long. The sum of the lengths of the input/output terminals 71 is likely to be large when they have different lengths. In this embodiment, since the input/output terminals 71 are formed so as to extend in the direction perpendicular to the stacking direction X and parallel to the plane of the frame (lateral direction Y), the lengths of the input/output terminals 71 can be made nearly the same with one another, and accordingly, the sum of the lengths of the input/output terminals 71 can be made shorter. This makes it possible to reduce the manufacturing cost of the power conversion apparatus 1.

The internal unit 10 includes the pressure member 12. The pressure member 12 is interposed between the rear wall section 53 of the frame 5 and the rear end of the stacked body 11 whose front end is supported by the front wall section 52 of the frame 5. Accordingly, the reaction force of the pressure member 12 can be supported by the frame 5. Accordingly, the case 4 is not required to have rigidity large enough to bear the reaction force of the pressure member 12, or to include ribs. This makes it possible to make the case 4 light in weight and less expensive.

The frame 5 includes the four unit fixing sections 51, two of them being disposed on one side of the stacking direction X, the other two of them being disposed on the other side of the stacking direction X. These four unit fixing sections 51 are located more outward in the stacking direction X than the pair of the supporting portions of the frame 5 (the inner surface 521 of the front wall section 52 and the inner surface 531 of the rear wall section 531) applied with the reaction force toward outside in the stacking direction X from the stacked body 11 and the pressure member 12. Accordingly, the frame 5 can resist the reaction force of the stacked body 11 and the pressure member 12 with the aid of the case 4. This is because the case 4 reinforces the fame 5, to thereby prevent the frame 5 from being deformed.

The fame 5 includes the front wall section 52, the rear wall section 53 and the pair of the side wall sections 54. Accordingly, the stacked body 11 can be held stably within the frame 5. The wall thickness of the front and rear wall sections 52 and 53 is larger than that of the side wall sections 54. That is, as shown in FIGS. 4 and 5, the wall thickness t1 is larger than the wall thickness t2. Accordingly, it is possible to improve the rigidities of the front and rear wall sections 52 and 53 receiving the reaction force of the pressure member 12, while reducing the weight of the side wall sections 54 not directly receiving the reaction force of the pressure member 12. This makes it possible to make the frame 5 light in weight, while ensuring the frame 5 to have rigidity large enough to resist the reaction force of the pressure member 12.

As shown in FIG. 4, part of each of the front and rear wall sections 52 and 53 is constituted as the roughly H-shaped wall section 55. Accordingly, the frame 5 can be made light in weight, while ensuring the high rigidity of the front and rear wall sections 52 and 53. As shown in FIG. 5, since each of the side wall sections 54 is constituted as the roughly L-shaped wall section, it is possible to reduce the weight of the side wall sections 54 and the material cost, while ensuring them to have sufficient rigidity.

As shown in FIG. 10, the semiconductor modules 21 stacked together with cooling tubes 31 have the structure in which the main electrode terminals 212 and the control terminals 213 project toward the opposite sides in the height direction Z, and the frame 5 is open to both sides in the height direction Z. Accordingly, as shown in FIGS. 8 and 13 to 15, the bus bars 70 and 700 and the control circuit board 6 can be easily assembled to the semiconductor modules 21.

The internal unit 10 includes also the control circuit board 6. Accordingly, since it is not necessary to assemble the control circuit board 6 directly to the case 4, the assembling work of the control circuit board 6 can be facilitated, and external force applied to the control circuit boar 6 can be reduced.

As shown in FIG. 2, the unit fixing sections 51 provided in the frame 5 are located outward of the outer edge of the control circuit board 6. Accordingly, the internal unit 10 can be easily assembled to the case 4. This is because if the unit fixing sections 51 are located inward of the outer edge of the control circuit board 6, the internal unit 10 assembled with the control circuit board 6 cannot be easily fixed to the case 4.

In this case, to fix the internal unit 10 to the case 4, it is necessary to drill holes penetrating the wall of the case 4 through which bolts or the like are inserted in, for example. However, in this case, not only the workability is lowered, but also more sealing members have to be used to ensure the water tightness of the case 4. By locating the unit fixing sections 51 outward of the outer edge of the control circuit board 6, such a problem can be removed.

The board fixing sections 56 of the frame 5 are located more inward than the unit fixing sections 51. This facilitates connecting the control circuit board G to the frame 5, and connecting the internal unit 10 to the case 4.

The internal unit 10 includes also the capacitor 22. Accordingly, it is possible to reduce external force applied to the capacitor 22. Further, it is possible to suppress vibration of the capacitor 22 being transmitted to the outside through the case 4. This makes it possible to suppress unpleasant vibration sound from occurring in the vehicle cabin due to vibration of the capacitor 22.

As shown in FIG. 3, the capacitor fixing sections 57 provided in the frame 5 are located more inward than the unit fixing sections 51. Accordingly, the capacitor 22 can be easily fixed to the frame 5, and the internal unit 10 can be easily assembled to the case 4.

The frame 5 includes the plurality of the bus bar fixing sections 58 for fixing the bus bars 70 and the bus bar assembly 72. Accordingly, the bus bars 70 and the bus bar assembly 72 can be stably fixed to the frame 5. As shown in FIGS. 3 and 8, two of the bus bar fixing sections 58 are located at the position closer to the terminal block 7 than to the center of the frame 5. Accordingly, the bus bar assembly 72 can be stably fixed to the frame 5, and the input/output terminals 71 can be stably disposed on the terminal block 7. As a result, a stable connection between the input/output terminals 71 and external terminals can be ensured.

The internal unit 10 includes all the electronic components constituting the power conversion circuit. Accordingly, all the electronic components constituting the power conversion circuit can be protected from an external force, and the power conversion apparatus easy to manufacture and excellent in maintainability can be provided.

As described above, according to the first embodiment, there is provided a less expensive power conversion apparatus which is capable of reducing an external force applied to its electronic components while improving the rigidity of its case, easy to assemble its terminal block, and excellent in water tightness and maintainability.

Second Embodiment

Figure 20:
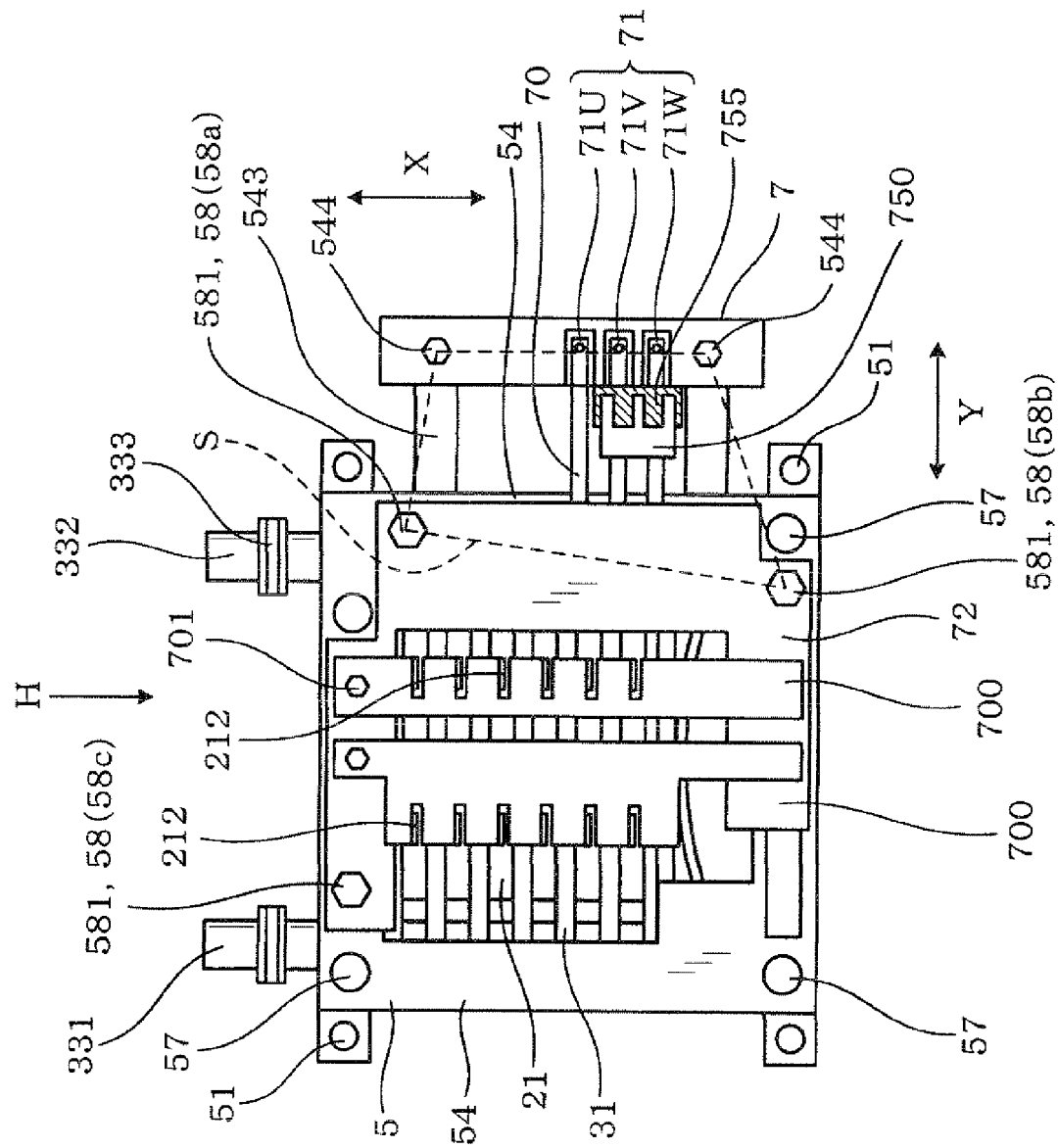
FIG. 20 is a plan view of a power conversion apparatus according to a second embodiment of the invention.
Figure 21:
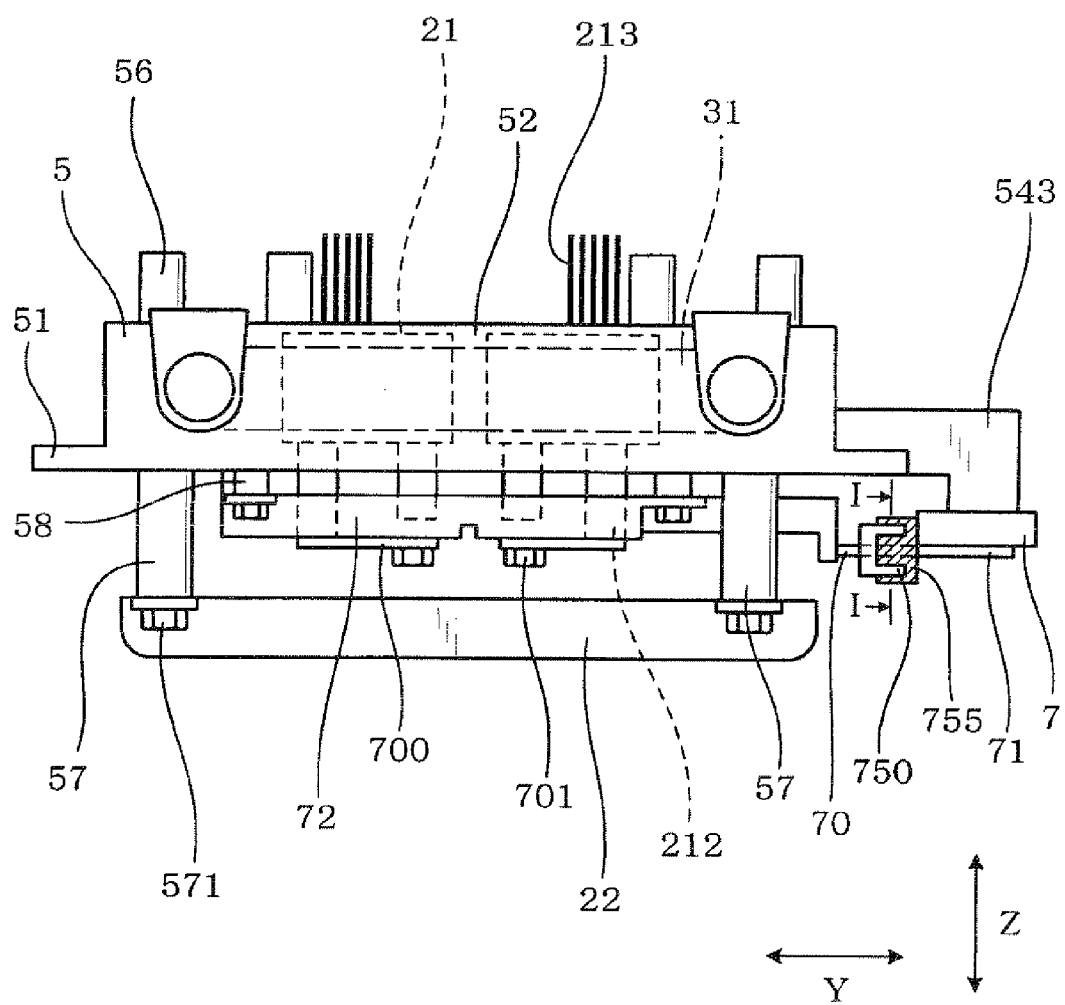
FIG. 21 is a view on the arrow H of FIG. 20.

Next, a second embodiment of the invention is described. As shown in FIGS. 20 and 21, the power conversion apparatus 1 according to the second embodiment is additionally provided with a current sensor 750 for measuring the currents flowing through the input/output terminals 71. Like in the first embodiment, the internal unit 10 of this embodiment includes the bus bars 70 formed with the input/output terminals 71. The frame 5 includes the bus bar fixing sections 58 (58a, 58b and 58c in FIG. 20) for fixing the bus bars 70, and the terminal block fixing sections 544 for fixing the terminal block 7.

The current sensor 750 is fixed to the terminal block 7 to measure the currents respectively flowing through the input/output terminals 71V and 71W. Here, two of the bus bar fixing sections 58 located closer to the terminal block 7 than to the center of the frame 5 are referred to as proximal bus bar fixing sections 58a and 58b. In this embodiment, the positions of the proximal bus bar fixing sections 58a and 58b, and the terminal block fixing sections 544 are determined such that the current sensor 750 is located within the quadrangle S whose apexes are defined by the proximal bus bar fixing sections 58a and 58b, and the terminal block fixing sections 544 when viewed from the projecting direction of the main electrode terminals 212 (in the height direction Z). The positions of the proximal bus bar fixing sections 58a and 58b and the terminal block fixing sections 544 may be determined such that the current sensor 750 is located within a triangle or pentagon instead of the quadrangle S.

Figure 22:
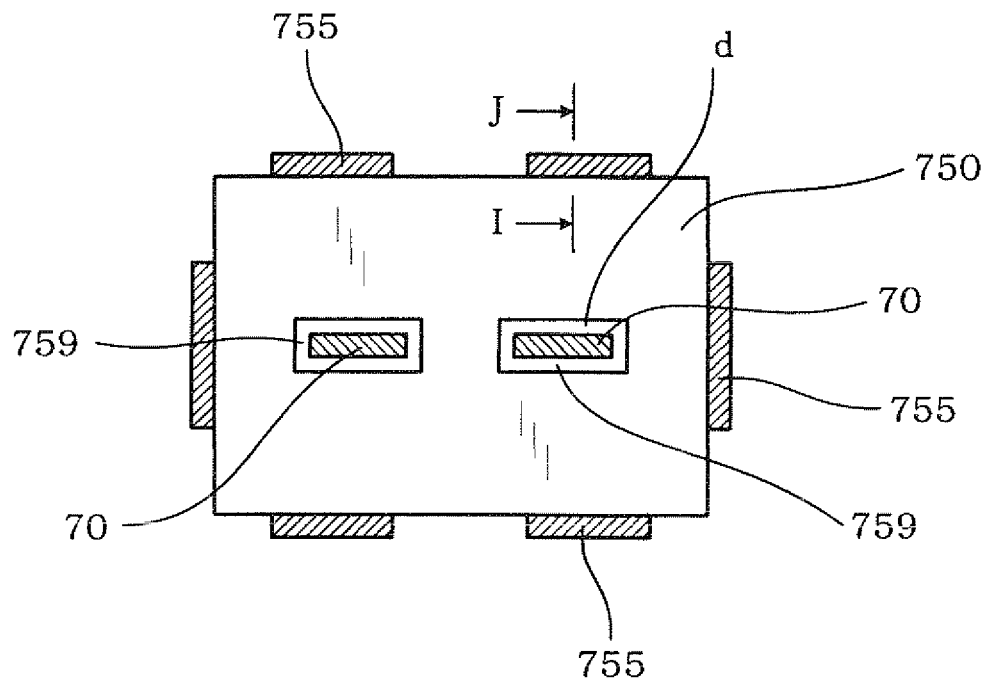
FIG. 22 is a cross-sectional view of FIG. 21 along the line I-I.
Figure 23:
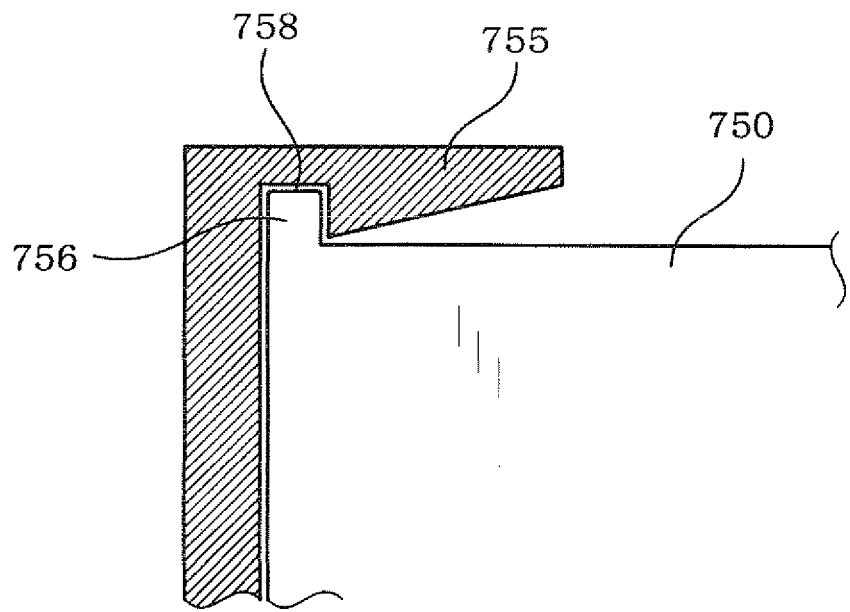
FIG. 23 is a cross-sectional view of FIG. 21 along the line J-J.

As shown in FIG. 22, the terminal block 7 is formed with engaging claws 755 for fixing the current sensor 750 to the terminal block 7. The current sensor 750 is formed with engagement sections 756 projecting outward as shown in FIG. 23 at its periphery. The current sensor 750 is formed with two through holes 759 (see FIG. 22) through which two of the bus bars 70 pass. Between the though hole 759 and the circumference of the bus bar 70 passing therethrough, a clearance d is ensured.

To manufacture the power conversion apparatus 1, the bus bars 70 are inserted into the through holes 759 of the current sensor 750, and the terminal block 70 is fixed to the support arms 543. Thereafter, the current sensor 750 is pressed into the terminal block 7. In this procedure, the engagement sections 756 advances while elastically deforming the engaging claws 755 until they enter concave portions 758 formed in the engaging claws 755, to thereby fix the current sensor 750. The components of this embodiment are the same as those of the first embodiment except for the above.

The second embodiment provides the following advantages. The power conversion apparatus 1 according to this embodiment has the structure which makes it hard for the current sensor 750 to malfunction as explained in the following. There exist the proximal bus bar fixing sections 58a and 58b, and the terminal block fixing sections 544 around the current sensor 750. Since the terminal block fixing sections 544 are formed at such positions that the terminal block 7 fixed to the terminal block fixing sections 544 is hard to wobble, the current sensor 750 fixed to the terminal block 7 is also hard to wobble. Further, the proximal bus bar fixing sections 58a and 58b are formed at positions where the bus bars 70 fixed to the frame 5 are hard to wobble. Hence, by fixing the current sensor 750 at the position surrounded by the terminal board fixing sections 544 and the proximity bus bar fixing sections 58a and 58b, it is possible to make the current sensor 750 hard to wobble to thereby protect the current sensor 750 from external vibration. Accordingly, according to this embodiment, the current sensor 750 does not malfunction easily. Other than the above, this embodiment provides the same advantages as those provided by the first embodiment.

Third Embodiment

Next, a third embodiment of the invention is described with reference to FIGS. 24 to 27. The third embodiment differs from the first embodiment in that the position of the terminal block 7 is changed and the current sensor 750 is additionally provided. Like in the first embodiment, the internal unit 10 according to this embodiment includes the bus bars 70 formed with the input/output terminals 71. The frame 5 includes the bus bar fixing sections 58 for fixing the bus bars 70, and the terminal board fixing sections 544 for fixing the terminal block 7.

Figure 24:
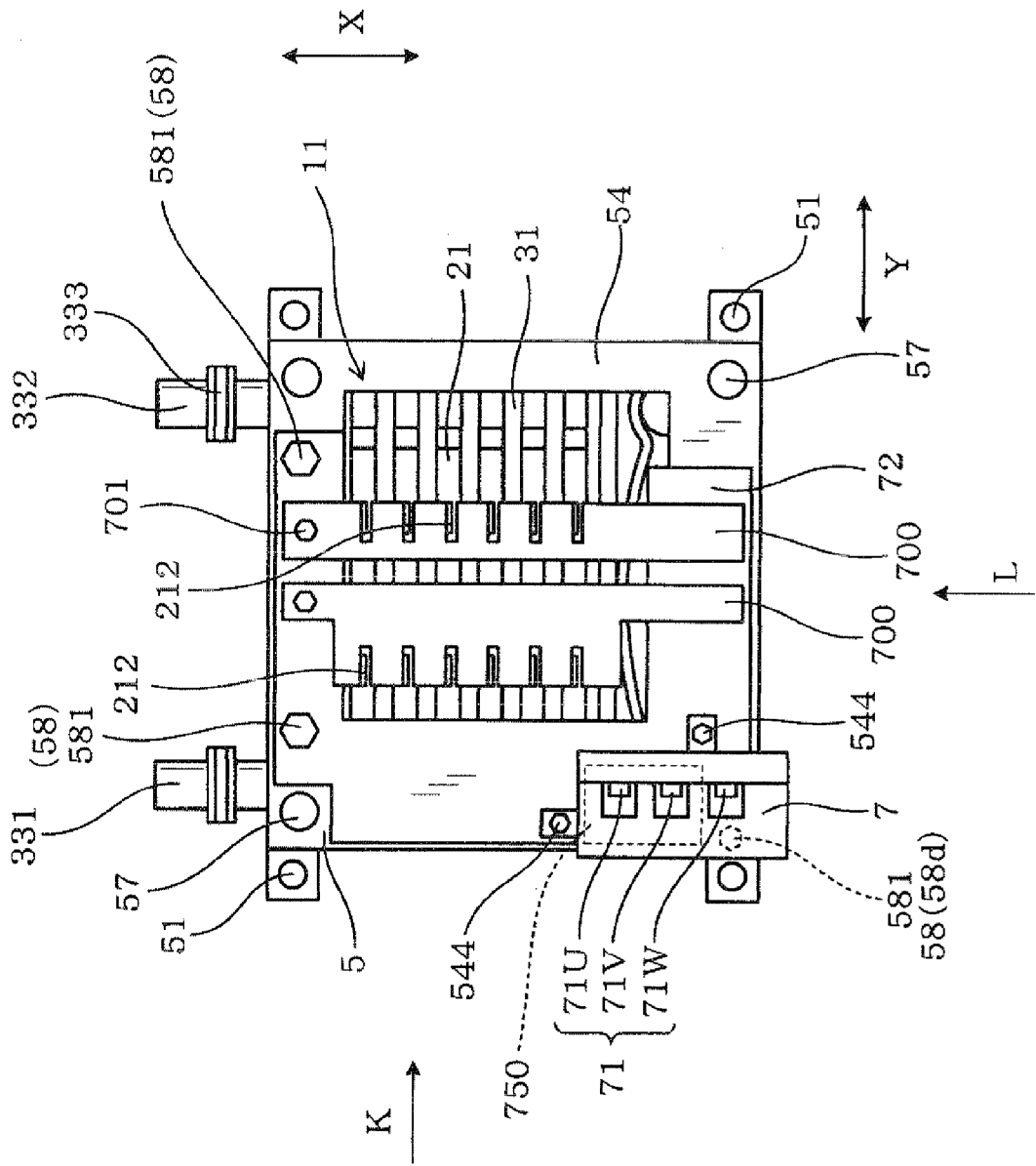
FIG. 24 is a plan view of a power conversion apparatus according to a third embodiment of the invention.
Figure 25:
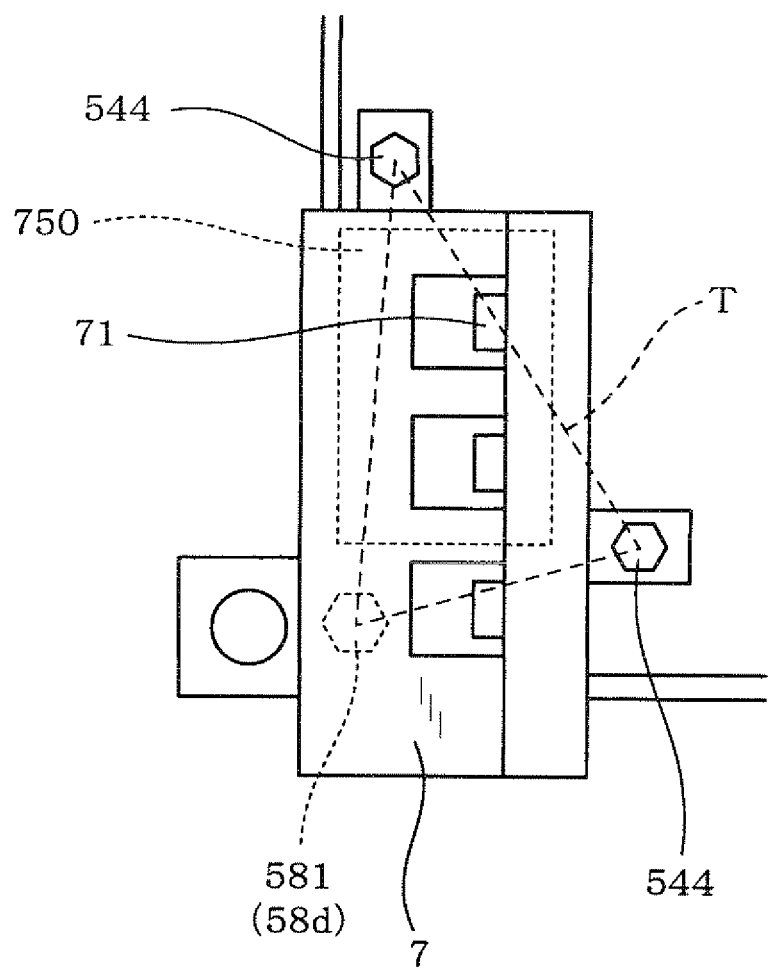
FIG. 25 is an enlarged view of main parts of FIG. 24.
Figure 26:
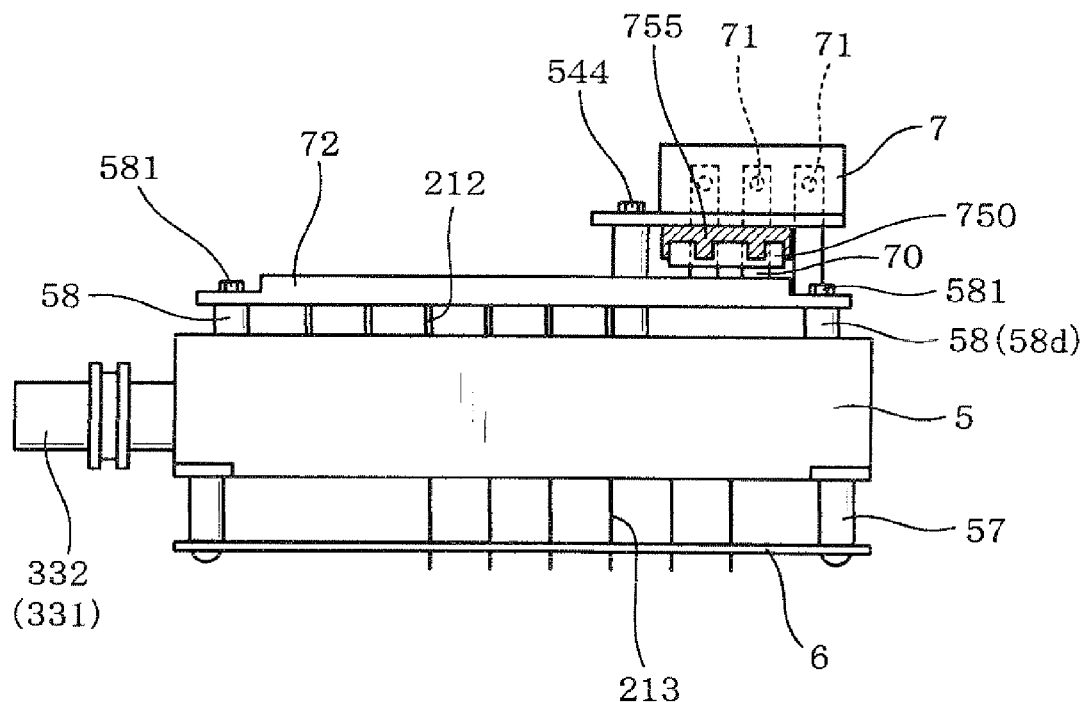
FIG. 26 is a view on the arrow K of FIG. 24.
Figure 27:
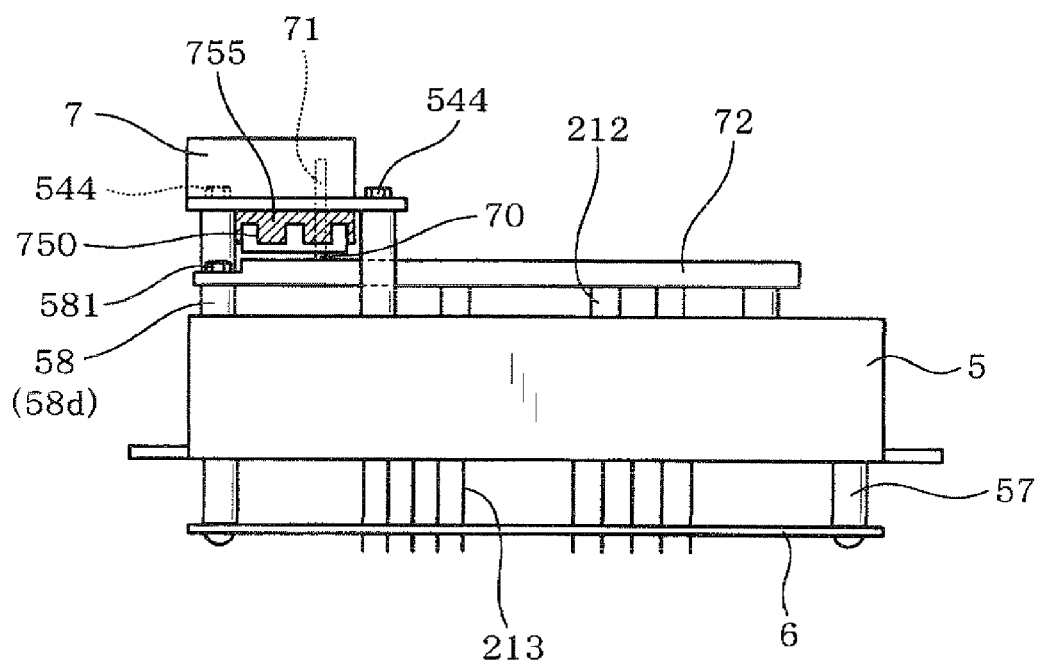
FIG. 27 is a view on the arrow L of FIG. 24.

The current sensor 750 is fixed to the terminal block 7 to measure the currents respectively flowing through the input/output terminals 71. As shown in FIG. 24, the bus bar fixing sections 58 include a distal bus bar fixing section 58d located more distant from the center of the frame 5 than from the input/output terminals 71. In this embodiment, the positions of the distal bus bar fixing section 58d, and the terminal block fixing sections 544 are determined such that a part of the current sensor 750 is located within the triangle T (see FIG. 25) whose apexes are defined by the distal bus bar fixing section 58d and the terminal block fixing sections 544 when viewed from the projecting direction of the main electrode terminals 212 (in the height direction Z). The positions of the distal bar fixing section 58d and the terminal block fixing sections 544 may be determined such that a part of the current sensor 750 is located within a quadrangle or pentagon instead of the triangle T. As shown in FIGS. 26 and 27, the input/output terminals 71 project in the same direction in which the main electrode terminals 212 of the semiconductor modules 21 project. Like in the first embodiment, the current sensor 750 is fixed to the terminal block 7 by the engaging claws 755. The components of this embodiment are the same as those of the first embodiment except for the above.

The third embodiment provides the following advantages. According to this embodiment, the current sensor 750 is hard to malfunction as explained below. In this embodiment, the distal bus bar fixing section 58d and the terminal block fixing sections 544 exist around the current sensor 750. Since the terminal block fixing sections 544 are formed at such positions that the terminal block 7 fixed to the terminal block fixing sections 544 is hard to wobble, the current sensor 750 fixed to the terminal block 7 is also hard to wobble. Further, the distal bus bar fixing sections 58d are formed at a position where the bus bars 70 fixed to the frame 5 are hard to wobble. Hence, by fixing the current sensor 750 at the position surrounded by the terminal board fixing sections 544 and the distant bus bar fixing section 58d, it is possible to make the current sensor 750 hard to wobble to thereby protect the current sensor 750 from external vibration. Accordingly, according to this embodiment, the current sensor 750 is hard to malfunction. Other than the above, this embodiment provides the same advantages as those provided by the first embodiment.

Fourth Embodiment

Next, a fourth embodiment of the invention is described with reference to FIGS. 28 to 34. In the power conversion apparatus 1 according to the fourth embodiment, the frame 5 is additionally provided with a wire holding section 59 for holding a conductive wire 15. At least one end of the conductive wire 15 is disposed within the case 4. In this embodiment, the conductive wire 15 connects the capacitor 22 with the control circuit board 6 within the case 4, so that the voltage across the capacitor 22 can be sent to the control circuit board 6 through the conductive wire 15 as a voltage signal indicative of the input voltage of the power conversion apparatus 1. The conductive wire 15 is covered with resin except both ends thereof, and has flexibility. The conductive wire 15 is laid outside the frame 5 to make a connection between the control circuit board 6 and the capacitor 22.

Figure 28:
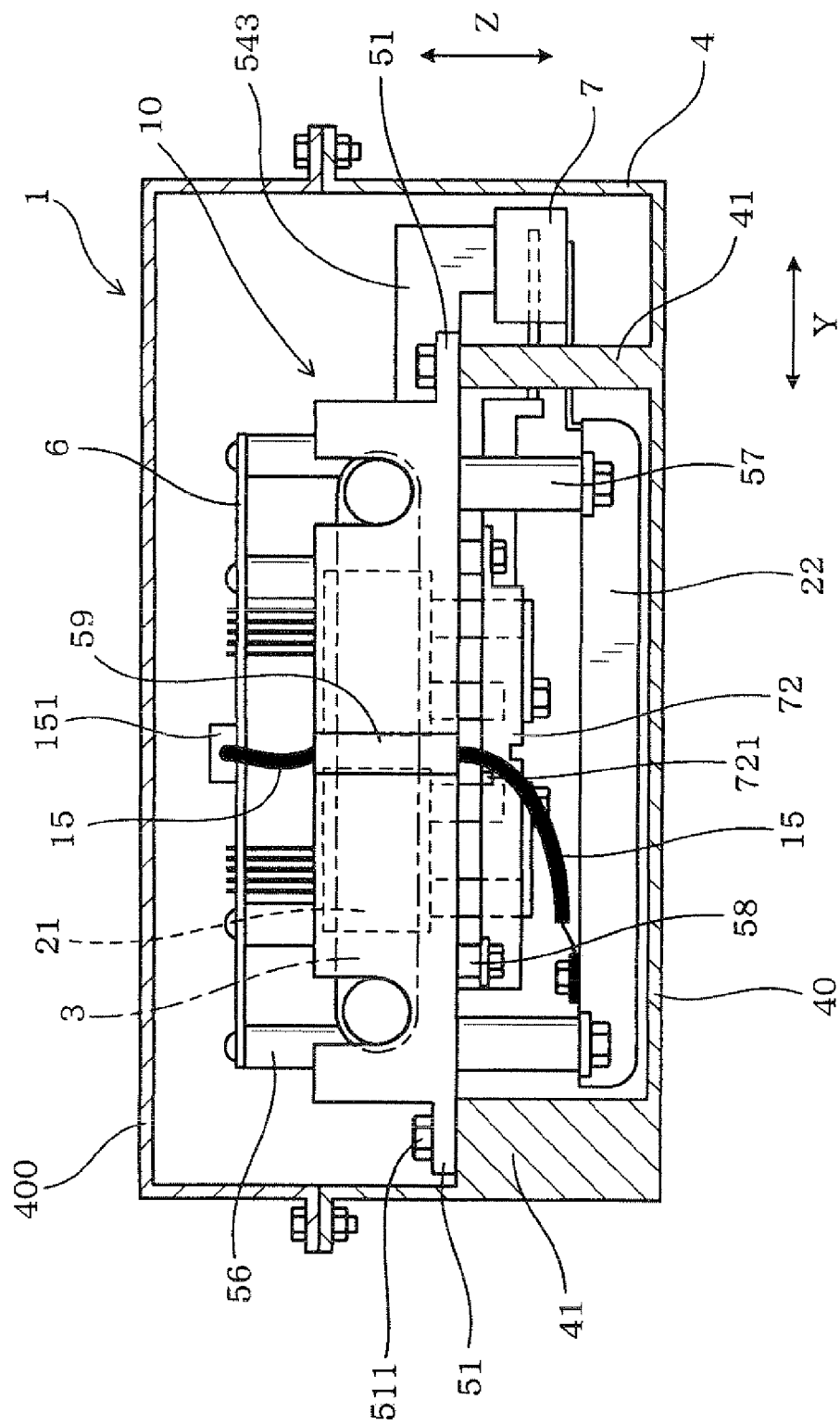
FIG. 28 is a cross-sectional view of a power conversion apparatus according to a fourth embodiment of the invention.
Figure 29:
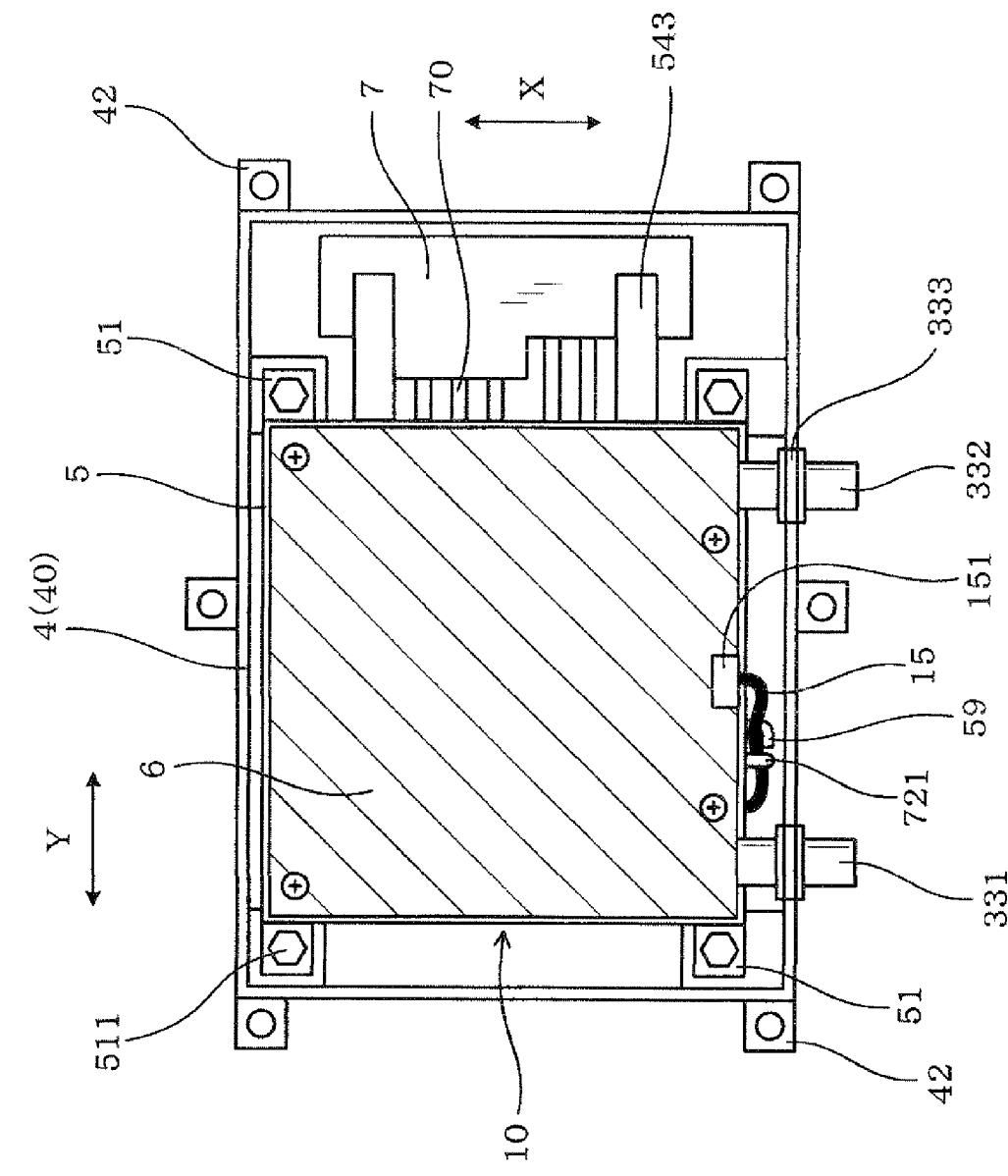
FIG. 29 is a plan view of the power conversion apparatus according to the fourth embodiment before a lid body is assembled.
Figure 30:
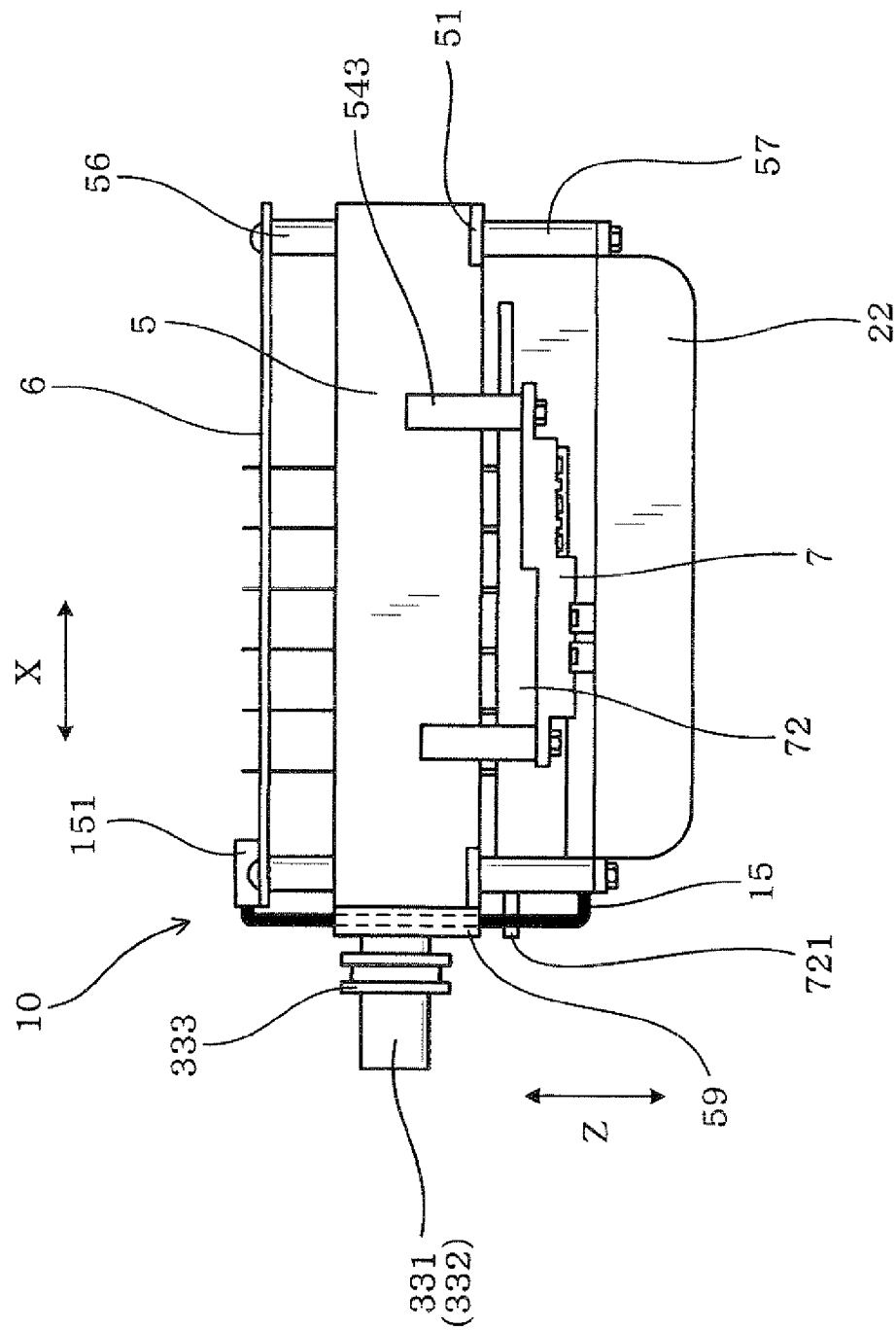
FIG. 30 is a side view of an internal unit of the power conversion apparatus according to the fourth embodiment.
Figure 31:
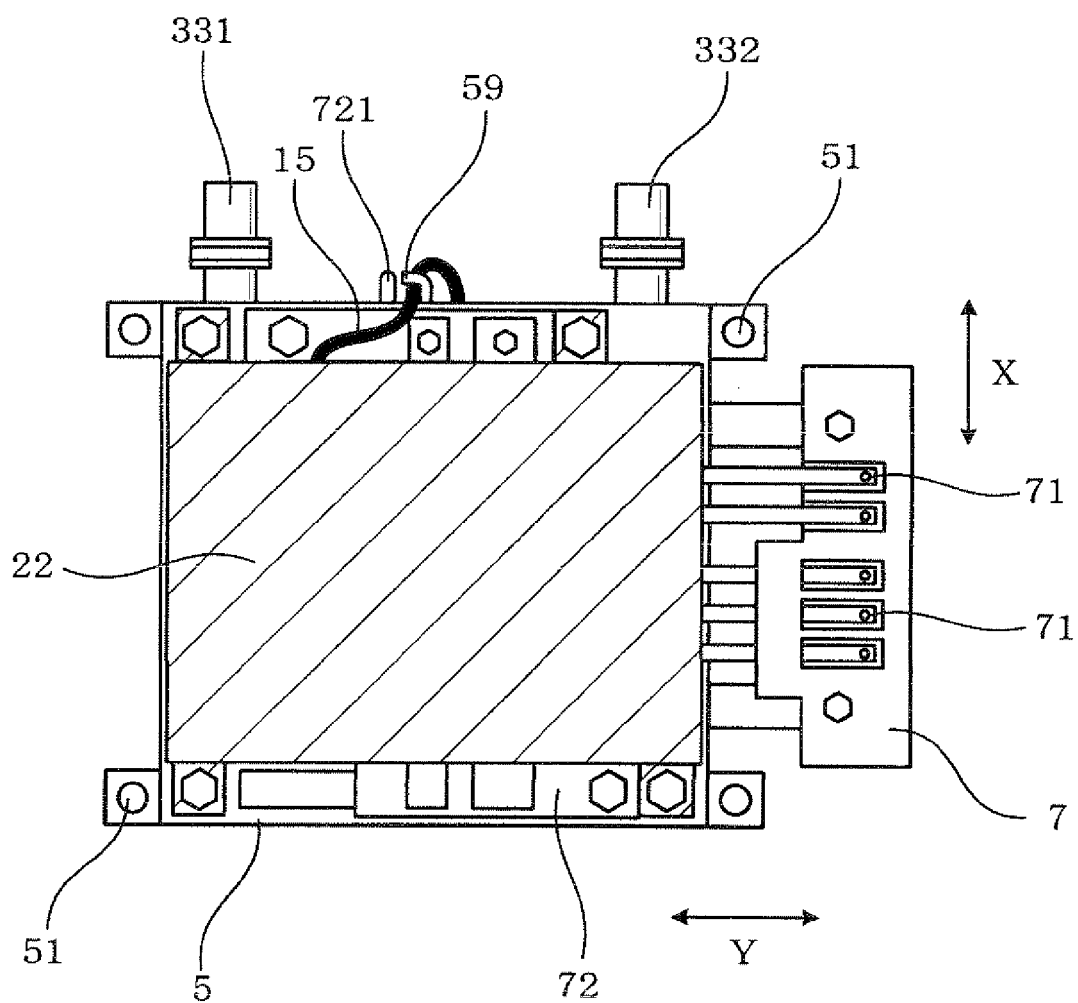
FIG. 31 is a bottom view of the internal unit of the fourth embodiment.
Figure 32:
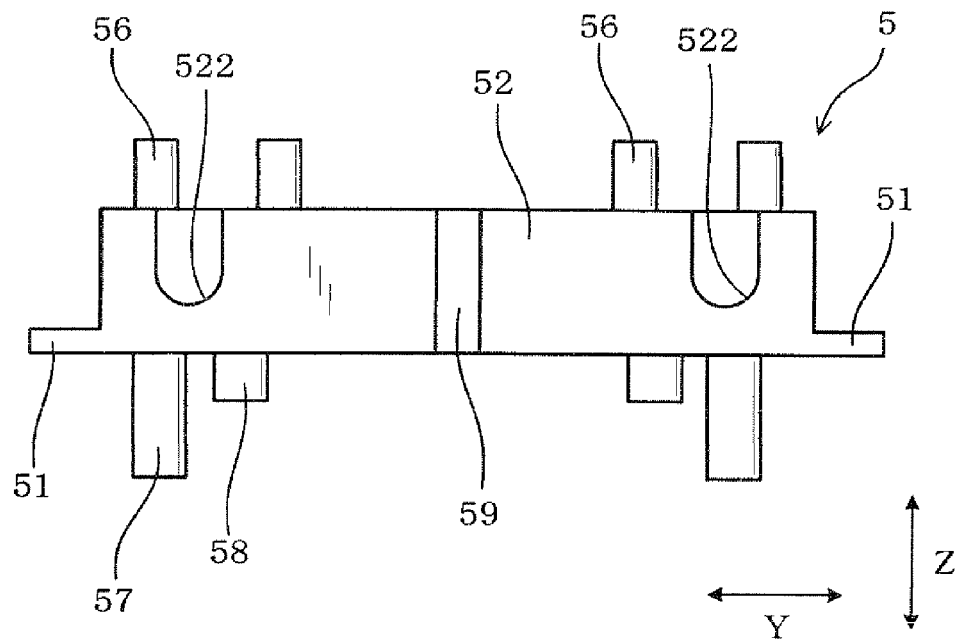
FIG. 32 is a front view of the frame of the fourth embodiment.
Figure 33:
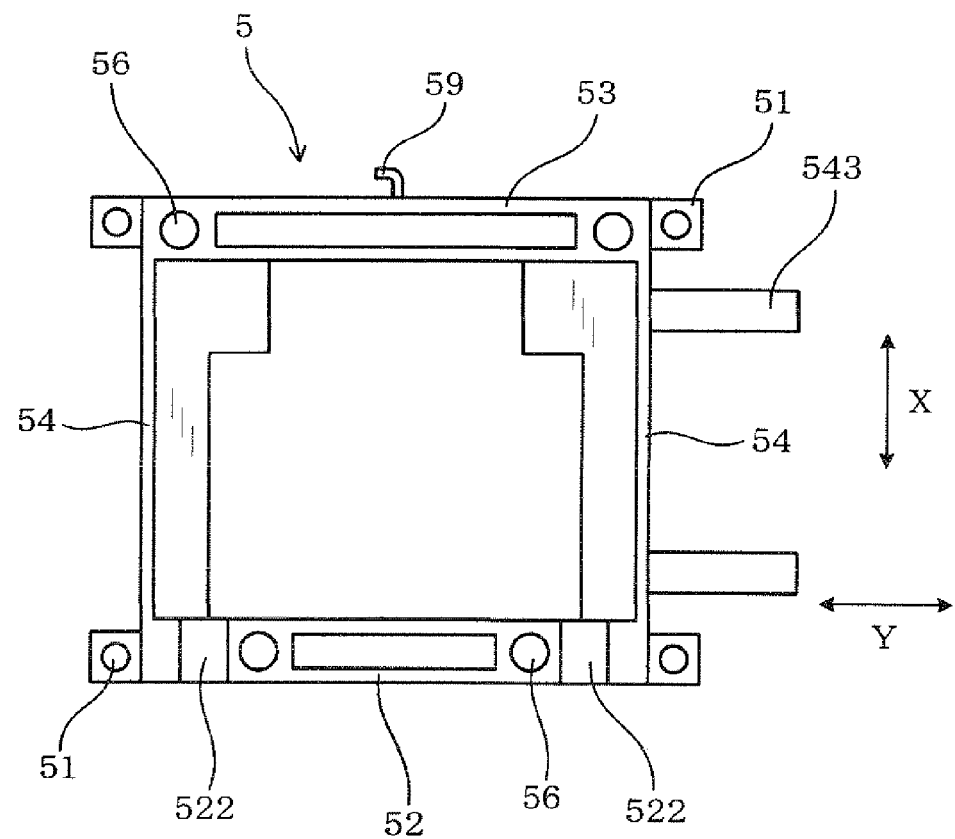
FIG. 33 is a plan view of the frame of the fourth embodiment.
Figure 34:
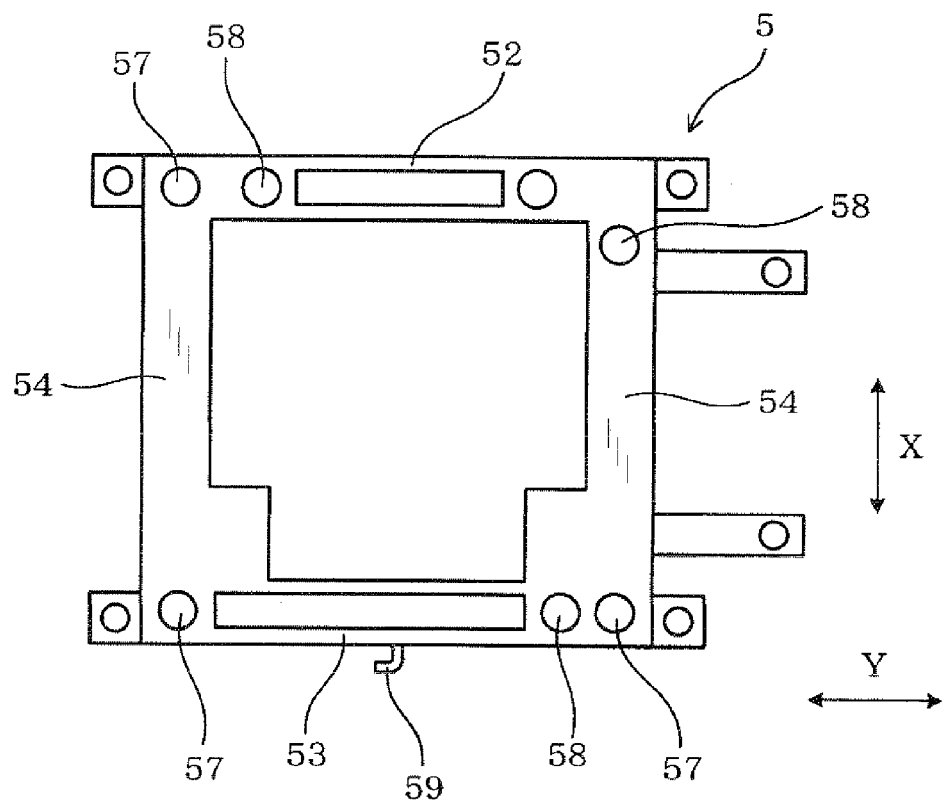
FIG. 34 is a bottom view of the frame of the fourth embodiment.
Figure 35:
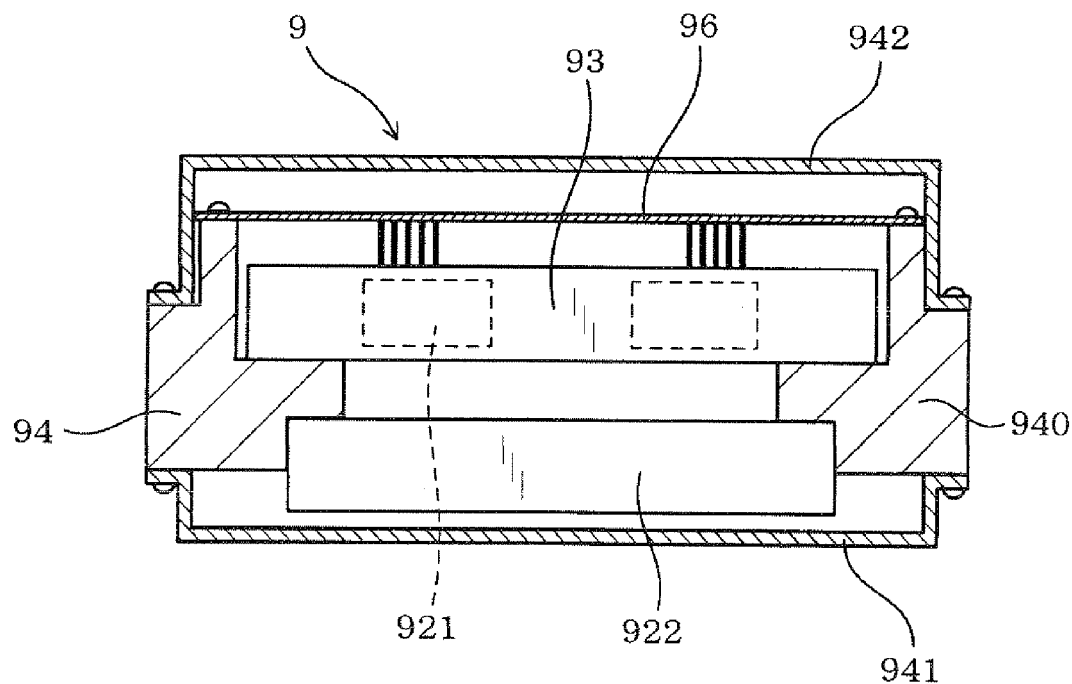
FIG. 35 is a cross-sectional view of a conventional power conversion apparatus.

The wire holding section 59 has a hook-like shape when viewed from the height direction Z as shown in FIGS. 29, 31, 33 and 34, and extends in the height direction Z as shown in FIGS. 28, 30 and 32. The wire holding section 59 is formed in the front wall section 52 of the frame 5 so as to project outward therefrom.

As shown in FIGS. 29 and 31, a part of the conductive wire 15 is fitted in the space between the wire holding section 59 and the front wall section 52.

As shown in FIGS. 28 to 31, the bus bar assembly 72 is formed with a forward projecting section 721 projecting forward in the stacking direction X. The forward projecting section 721 is located in a position opposite to the open side of the wire holding section 59 when viewed from the height direction Z. The forward projecting section 721 serves to prevent the conductive wire 15 from coming off the wire holding section 59. The wire holding section 59 is located at nearly the same position in the lateral direction Y as a connector section 151 of the conductive wire 15 for connection with the control circuit board 6. The components of this embodiment are the same as those of the first embodiment except for the above.

In this embodiment, the conductive wire 15 can be laid along the frame 5. Accordingly, the internal unit 10 can be prevented from being caught by the conductive wire 15 when it is put in or taken out of the case 4. Other than the above, this embodiment provides the same advantages as those provided by the first embodiment.

It is possible that the wire holding section 59 holds a wire different form the conductive wire 15 provided for making a connection between the capacitor 22 and the control circuit board 6. The wire holding section 59 may be formed in a shape and a position different from those described above, so that the conductive wire 15 can be laid along the lateral direction Y. The wire holding section 59 may be formed in two or more positions in the frame 5.

In the above embodiments, the cooler is constituted as the stacked body of the cooling tubes and the semiconductor modules. However, the present invention is also applicable to a power conversion apparatus including a cooling structure in which a semiconductor element, a metal body thermally coupled to this semiconductor element and a sealing member are integrated as a sealed semiconductor-integrated cooling structure having a coolant channel allowing coolant to flow toward the metal body, and a plurality of such sealed semiconductor-integrated cooling structures are stacked such that the sealed semiconductor-integrated cooling structures and coolant passages alternate in the stacking direction.

In the above embodiments, the pressure member is disposed between the rear wall section and the rear end of the stacked body. However, the pressure member may be disposed between the front wall section and the front end of the stacked body. In this case, when the coolant introduction tube and the coolant discharge tube are disposed side by side protruding from the front wall section, the pressure member may be disposed between the front wall section and the front end of the stacked body so as to be located between the coolant introduction tube and the coolant discharge tube.

The above explained preferred embodiments are exemplary of the invention of the present application which is described solely by the claims appended below. It should be understood that modifications of the preferred embodiments may be made as would occur to one of skill in the art.

What is claimed is:

1. A power conversion apparatus comprising:
   electronic components constituting a power conversion circuit;
   a cooler for cooling at least some of the electronic components;
   a case housing the at least some of the electronic components and the cooler; and
   a frame that is removably attached to an interior of the case;
   wherein
   the at least some of the electronic components and the cooler comprise an internal unit that is fixed directly to only the frame,
   the frame has such a shape that at least some of the electronic components constituting the internal unit are surrounded on four sides by the frame and are disposed inside the frame,
   the frame includes a terminal block on which input/output terminals for inputting and outputting controlled power are mounted for providing connection between the input/output terminals and external devices, and
   the frame is disposed in the case.

2. The power conversion apparatus according to claim 1, wherein the frame includes at least one support arm formed in an outer surface of a wall section of the frame so as to project outward, the terminal block being supported by the support arm.

3. The power conversion apparatus according to claim 1, wherein
   the internal unit includes, as the electronic components, semiconductor modules constituted of a main body section incorporating therein switching elements and main electrode terminals projecting from the main body section,
   the cooler includes therein coolant passages,
   a stacked body in which the coolant passages and the semiconductor modules are stacked alternately in a stacking direction parallel to a plane of the frame is disposed inside the frame,
   the internal unit includes bus bars made of a conductive material,
   each of the bus bars is formed with a corresponding one of the input/output terminals at an end thereof,
   the main electrode terminals are respectively connected to the other ends of the bus bars, and
   the input/output terminals extend in a direction perpendicular to the stacking direction and parallel to the plane of the frame.

4. A power conversion apparatus comprising:
   electronic components constituting a power conversion circuit;
   a cooler for cooling at least some of the electronic components, wherein the cooler includes therein coolant passages; and
   a case housing the at least some of the electronic components and the cooler;
   wherein
   the at least some of the electronic components and the cooler are fixed to and integrated in a frame as an internal unit, and the internal unit includes, as the electronic components, semiconductor modules constituted of a main body section incorporating therein switching elements and main electrode terminals projecting from the main body section
   the frame has such a shape that at least some of the electronic components constituting the internal unit are disposed inside the frame, and
   the frame includes a terminal block on which input/output terminals for inputting and outputting controlled power are mounted for providing connection between the input/output terminals and external devices,
   a stacked body in which the coolant passages and the semiconductor modules are stacked alternately in a stacking direction parallel to a plane of the frame is disposed inside the frame,
   the internal unit includes bus bars made of a conductive material,
   each of the bus bars is formed with a corresponding one of the input/output terminals at an end thereof,
   the main electrode terminals are respectively connected to the other ends of the bus bars, and
   the input/output terminals extend in a direction perpendicular to the stacking direction and parallel to the plane of the frame,
   the frame includes bus bar fixing sections for fixing the bus bars, and terminal block fixing sections for fixing the terminal block,
   a current sensor for measuring at least one of currents respectively flowing through the input/output terminals is fixed to the terminal block,
   the bus bar fixing sections includes a proximal bus bar fixing section located at a position closer to the terminal block than to a center of the frame, and positions of the proximal bus bar fixing section and the terminal block fixing sections are determined such that at least a part of the current sensor is located within a polygon whose apexes are defined by the proximal bus bar fixing section and the terminal block fixing sections when viewed from a projecting direction of the main electrode terminals.

5. A power conversion apparatus comprising:
electronic components constituting a power conversion circuit;
a cooler for cooling at least some of the electronic components, wherein the cooler includes therein coolant passages; and
a case housing the at least some of the electronic components and the cooler;
wherein
the at least some of the electronic components and the cooler are fixed to and integrated in a frame as an internal unit, and the internal unit includes, as the electronic components, semiconductor modules constituted of a main body section incorporating therein switching elements and main electrode terminals projecting from the main body section
the frame has such a shape that at least some of the electronic components constituting the internal unit are disposed inside the frame, and
the frame includes a terminal block on which input/output terminals for inputting and outputting controlled power are mounted for providing connection between the input/output terminals and external devices,
a stacked body in which the coolant passages and the semiconductor modules are stacked alternately in a stacking direction parallel to a plane of the frame is disposed inside the frame,
the internal unit includes bus bars made of a conductive material,
each of the bus bars is formed with a corresponding one of the input/output terminals at an end thereof,
the main electrode terminals are respectively connected to the other ends of the bus bars, and
the input/output terminals extend in a direction perpendicular to the stacking direction and parallel to the plane of the frame,
the frame includes bus bar fixing sections for fixing the bus bars, and terminal block fixing sections for fixing the terminal block,
a current sensor for measuring at least one of currents respectively flowing through the input/output terminals is fixed to the terminal block,
the bus bar fixing sections includes a distal bus bar fixing section located at a position more distant from a center of the frame than from the input/output terminals, and positions of the distal bus bar fixing section and the terminal block fixing sections are determined such that at least a part of the current sensor is located within a polygon whose apexes are defined by the distal bus bar fixing section and the terminal block fixing sections when viewed from a projecting direction of the main electrode terminals.

6. The power conversion apparatus according to claim 3, wherein the coolant passages are formed by cooling tubes.

7. The power conversion apparatus according to claim 6, wherein the input/output terminals extend in a longitudinal direction of the cooling tubes.

8. The power conversion apparatus according to claim 1, wherein the frame also surrounds at least portions of the cooler from four sides.

9. The power conversion apparatus according to claim 1, wherein the at least some of the electronic components comprise semiconductor modules, wherein the cooler includes cooling tubes, each of which includes therein a coolant passage, and wherein the internal unit is constituted as a stacked body in which the cooling tubes and the semiconductor modules are stacked alternately.

* * * * *